(12) United States Patent
Cok

(10) Patent No.: US 10,289,252 B2
(45) Date of Patent: May 14, 2019

(54) DISPLAY WITH INTEGRATED ELECTRODES

(71) Applicant: X-Celeprint Limited, Cork (IE)

(72) Inventor: Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 14/878,642

(22) Filed: Oct. 8, 2015

(65) Prior Publication Data

US 2017/0102797 A1  Apr. 13, 2017

(51) Int. Cl.
*G06F 3/044* (2006.01)
*G06F 3/041* (2006.01)
(Continued)

(52) U.S. Cl.
CPC .......... *G06F 3/044* (2013.01); *G02F 1/13338* (2013.01); *G02F 1/133603* (2013.01); *G06F 3/0412* (2013.01); *G06F 3/0416* (2013.01); *G09G 3/32* (2013.01); *H01L 25/0753* (2013.01); *H01L 25/167* (2013.01); *H01L 33/60* (2013.01); *H01L 33/62* (2013.01); *G02F 1/13318* (2013.01); *G02F 1/133553* (2013.01); *G02F 2001/133601* (2013.01);
(Continued)

(58) Field of Classification Search
CPC ... G06F 3/044; G06F 3/0412; G02F 1/133603
See application file for complete search history.

(56) References Cited

U.S. PATENT DOCUMENTS 4,746,202 A   5/1988  Perilloux et al.
5,060,027 A   10/1991 Hart et al.
(Continued)

FOREIGN PATENT DOCUMENTS

CN   103677427 A   3/2014
EP    1662301 A1   5/2006
(Continued)

OTHER PUBLICATIONS

U.S. Appl. No. 14/788,632, filed Jun. 30, 2015, X-Celeprint Limited.
(Continued)

*Primary Examiner* — Ricardo Osorio
(74) *Attorney, Agent, or Firm* — William R. Haulbrook; Michael D. Schmitt; Choate, Hall & Stewart LLP

(57) ABSTRACT

An inorganic light-emitting diode display with integrated electrodes includes a display surface having a display area and a plurality of spatially separated light-emitting diodes (such as inorganic light-emitting diodes) disposed in rows on the display surface in the display area. The inorganic light-emitting diodes in each row of inorganic light-emitting diodes are electrically connected by one or more electrical conductors. One or more row touch electrodes are disposed in rows over the display surface in the display area between the rows of inorganic light-emitting diodes and are disposed on the display surface and have a width that is larger than a length and width of the light-emitting diodes. A display with an integrated touch screen includes one or more sensing elements disposed in a common plane with the light emitters or on a side of the light emitters opposite the display surface.

23 Claims, 11 Drawing Sheets

(51) Int. Cl.
- *H01L 25/075* (2006.01)
- *H01L 33/62* (2010.01)
- *H01L 25/16* (2006.01)
- *H01L 33/60* (2010.01)
- *G09G 3/32* (2016.01)
- *G02F 1/1333* (2006.01)
- *G02F 1/1335* (2006.01)
- *G02F 1/133* (2006.01)

(52) U.S. Cl.
CPC .......... *G02F 2001/133616* (2013.01); *G02F 2201/50* (2013.01); *G02F 2203/02* (2013.01); *G06F 2203/04111* (2013.01); *G06F 2203/04112* (2013.01); *G09G 2300/0426* (2013.01); *G09G 2354/00* (2013.01)

(56) References Cited

U.S. PATENT DOCUMENTS

| | | |
|---|---|---|
| 5,550,066 A | 8/1996 | Tang et al. |
| 5,621,555 A | 4/1997 | Park |
| 5,625,202 A | 4/1997 | Chai |
| 5,748,161 A | 5/1998 | Lebby et al. |
| 5,815,303 A | 9/1998 | Berlin |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,288,824 B1 | 9/2001 | Kastalsky |
| 6,340,999 B1 | 1/2002 | Masuda et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,466,281 B1 | 10/2002 | Huang et al. |
| 6,504,180 B1 | 1/2003 | Heremans et al. |
| 6,577,367 B2 | 6/2003 | Kim |
| 6,650,382 B1 | 11/2003 | Sumida et al. |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,933,532 B2 | 8/2005 | Arnold et al. |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,402,951 B2 | 7/2008 | Cok |
| 7,417,648 B2 | 8/2008 | Credelle |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,614,757 B2 | 11/2009 | Nesterenko et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,872,722 B2 | 1/2011 | Kimura |
| 7,893,612 B2 | 2/2011 | Cok |
| 7,898,734 B2 | 3/2011 | Coleman et al. |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,948,172 B2 | 5/2011 | Cok et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,004,758 B2 | 8/2011 | Coleman et al. |
| 8,029,139 B2 | 10/2011 | Ellinger et al. |
| 8,039,847 B2 | 10/2011 | Nuzzo et al. |
| 8,058,663 B2 | 11/2011 | Fan et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,536,584 B2 | 9/2013 | Yao |
| 8,581,827 B2 | 11/2013 | Park et al. |
| 8,596,846 B2 | 12/2013 | Yankov et al. |
| 8,619,011 B2 | 12/2013 | Kimura |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,836,624 B2 | 9/2014 | Roberts et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,912,020 B2 | 12/2014 | Bedell et al. |
| 8,946,760 B2 | 2/2015 | Kim |
| 8,987,765 B2 | 3/2015 | Bibl et al. |
| 9,048,449 B2 | 6/2015 | Kim et al. |
| 9,105,813 B1 | 8/2015 | Chang |
| 9,153,171 B2 | 10/2015 | Sakariya et al. |
| 9,178,123 B2 | 11/2015 | Sakariya et al. |
| 9,202,996 B2 | 12/2015 | Orsley et al. |
| 9,226,361 B2 | 12/2015 | Toth |
| 9,277,618 B2 | 3/2016 | Odnoblyudov et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,368,683 B1 | 6/2016 | Meitl et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,626,908 B2 | 4/2017 | Sakariya et al. |
| 9,698,308 B2 | 7/2017 | Bower et al. |
| 9,705,042 B2 | 7/2017 | Bower et al. |
| 9,716,082 B2 | 7/2017 | Bower et al. |
| 10,078,239 B2 * | 9/2018 | Sugita .................. G02F 1/1333 |
| 2001/0022564 A1 | 9/2001 | Youngquist et al. |
| 2002/0096994 A1 | 7/2002 | Iwafuchi et al. |

(56) References Cited

U.S. PATENT DOCUMENTS

| | | |
|---|---|---|
| 2004/0080483 A1 | 4/2004 | Chosa |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2009/0045420 A1 | 2/2009 | Eng et al. |
| 2009/0146921 A1 | 6/2009 | Takahashi |
| 2009/0278142 A1 | 11/2009 | Watanabe et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0043435 A1 | 2/2011 | Hebenstreit et al. |
| 2011/0069013 A1* | 3/2011 | Rabenstein ............ G06F 3/041 345/173 |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2012/0056835 A1 | 3/2012 | Choo et al. |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0206428 A1 | 8/2012 | Cok |
| 2012/0206499 A1 | 8/2012 | Cok |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1* | 9/2012 | Homma ................ G06F 3/0488 345/619 |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1* | 1/2014 | Yamazaki ............. G06F 3/0412 257/59 |
| 2014/0082934 A1 | 3/2014 | Cok |
| 2014/0084482 A1 | 3/2014 | Hu et al. |
| 2014/0085214 A1 | 3/2014 | Cok |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0159043 A1 | 6/2014 | Sakariya et al. |
| 2014/0159065 A1 | 6/2014 | Hu et al. |
| 2014/0175498 A1 | 6/2014 | Lai |
| 2014/0183446 A1 | 7/2014 | Nago et al. |
| 2014/0197509 A1 | 7/2014 | Haddad et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1* | 8/2014 | Fukutome ........... G02F 1/13338 349/12 |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0339495 A1* | 11/2014 | Bibl ...................... H01L 33/504 257/13 |
| 2014/0340900 A1 | 11/2014 | Bathurst et al. |
| 2014/0367633 A1 | 12/2014 | Bibl et al. |
| 2014/0367705 A1 | 12/2014 | Bibl et al. |
| 2015/0003040 A1 | 1/2015 | Bessho et al. |
| 2015/0015517 A1* | 1/2015 | Zhao ...................... G06F 3/041 345/173 |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | van de Ven et al. |
| 2015/0318328 A1 | 11/2015 | Bibl et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0004123 A1 | 1/2016 | Tanabe |
| 2016/0005721 A1 | 1/2016 | Bower et al. |
| 2016/0018094 A1 | 1/2016 | Bower et al. |
| 2016/0056725 A1 | 2/2016 | Kim et al. |
| 2016/0057822 A1 | 2/2016 | Chu |
| 2016/0057827 A1 | 2/2016 | Miskin |
| 2016/0057832 A1 | 2/2016 | Briggs et al. |
| 2016/0064363 A1 | 3/2016 | Bower et al. |
| 2016/0085120 A1 | 3/2016 | Xu |
| 2016/0093600 A1 | 3/2016 | Bower et al. |
| 2016/0103547 A1* | 4/2016 | Lu ........................ G06F 3/0416 345/174 |
| 2016/0131329 A1 | 5/2016 | Park et al. |
| 2016/0260388 A1 | 9/2016 | Yata et al. |

(56) References Cited

U.S. PATENT DOCUMENTS

| | | | |
|---|---|---|---|
| 2016/0266697 | A1 | 9/2016 | Cheng et al. |
| 2016/0343772 | A1 | 11/2016 | Bower et al. |
| 2016/0351539 | A1 | 12/2016 | Bower et al. |
| 2016/0364030 | A1* | 12/2016 | Peana ............... G06F 3/0412 |
| 2017/0005244 | A1 | 1/2017 | Bower et al. |
| 2017/0025075 | A1 | 1/2017 | Cok et al. |
| 2017/0025484 | A1 | 1/2017 | Forrest et al. |
| 2017/0047393 | A1 | 2/2017 | Bower et al. |
| 2017/0048976 | A1 | 2/2017 | Prevatte et al. |
| 2017/0061842 | A1 | 3/2017 | Cok et al. |
| 2017/0068362 | A1* | 3/2017 | Den Boer ............ G06F 3/0412 |
| 2017/0092863 | A1 | 3/2017 | Bower et al. |
| 2017/0122502 | A1 | 5/2017 | Cok et al. |
| 2017/0133818 | A1 | 5/2017 | Cok |
| 2017/0167703 | A1 | 6/2017 | Cok |
| 2017/0186740 | A1 | 6/2017 | Cok et al. |
| 2017/0187976 | A1 | 6/2017 | Cok |
| 2017/0206845 | A1 | 7/2017 | Sakariya et al. |
| 2017/0250219 | A1 | 8/2017 | Bower et al. |
| 2017/0256521 | A1 | 9/2017 | Cok et al. |
| 2017/0256522 | A1 | 9/2017 | Cok et al. |
| 2017/0287882 | A1 | 10/2017 | Cok et al. |

FOREIGN PATENT DOCUMENTS

| | | |
|---|---|---|
| EP | 2078978 A2 | 7/2009 |
| EP | 2148264 A2 | 1/2010 |
| EP | 2 610 314 A1 | 7/2013 |
| EP | 2703969 A2 | 3/2014 |
| JP | 11-142878 | 5/1999 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A4 | 7/2017 |
| WO | WO-2017/149067 A1 | 9/2017 |
| WO | WO-2017/174632 A1 | 10/2017 |

OTHER PUBLICATIONS

U.S. Appl. No. 14/807,311, filed Jul. 23, 2015, X-Celeprint Limited.
U.S. Appl. No. 14/822,866, filed Aug. 10, 2015, Bower et al.
Cok, R. S. et al., AMOLED displays with transfer-printed integrated circuits, Journal of SID 191(4):335-341(2011).
Hamer et al., "63.2: AMOLED Displays Using Transfer-Printed Integrated Circuits," SID 09 Digest, 40(2):947-950 (2009).
International Search Report, PCT/EP2016/074093, 7 pages, dated Apr. 3, 2017.
Johnson, K. et al., Advances in Red VCSEL Technology, Advances in Optical Technologies, 2012:569379, 13 pages (2012).
Kasahara, D. et al, Nichia reports first room-temperature blue/'green' VCSELs with current injection, Appl. Phys. Express, 4(7):3 pages (2011).
Koma, N. et al., 44.2: Novel Front-light System Using Fine-pitch Patterned OLED, SID, 08:655-658 (2008).
Partial International Search Report, PCT/EP2016/074093, 3 pages, dated Feb. 13, 2017.
Seurin, J.F. et al, High-power red VCSEL arrays, Proc. of SPIE 8639:1-9 (2013).
Written Opinion, PCT/EP2016/74093, 13 pages, dated Apr. 3, 2017.
Yoon, J. et al., Heterogeneously Integrated Optoelectronic Devices Enabled by MicroTransfer Printing, Adv. Optical Mater. 3:1313-1335 (2015).
Choi, H. W. et al., Efficient GaN-based Micro-LED Arrays, Mat. Res. Soc. Symp. Proc. 743:L6.28.1-L6.28.6 (2003).
Poher, V. et al., Micro-LED arrays: a tool for two-dimensional neuron stimulation, J. Phys. D: Appl. Phys. 41:094014 (2008).
International Search Report, PCT/EP2015/063709, dated Dec. 15, 2015, 6 pages.
International Search Report, PCT/EP2015/069553, dated Nov. 27, 2015, 6 pages.
Lee, S. H. etal, Laser Lift-Offof GaN Thin Film and its Application to the Flexible Light Emitting Diodes, Proc. of SPIE 8460:846011-1-846011-6 (2012).
Roscher, H., VCSEL Arrays with Redundant Pixel Designs for 10Gbits/s 2-D Space-Parallel MMF Transmission, Annual Report, optoelectronics Department, (2005).
Yaniv et al., A 640 x 480 Pixel Computer Display Using Pin Diodes with Device Redundancy, 1988 International Display Research Conference, IEEE, CH-2678-1/88:152-154 (1988).
U.S. Appl. No. 14/822,868, Bower et al.
Matioli, E. et al., High-brightness polarized light-emitting diodes, Light: Science & Applicaitons, 1:e22:1-7 (2012).

* cited by examiner

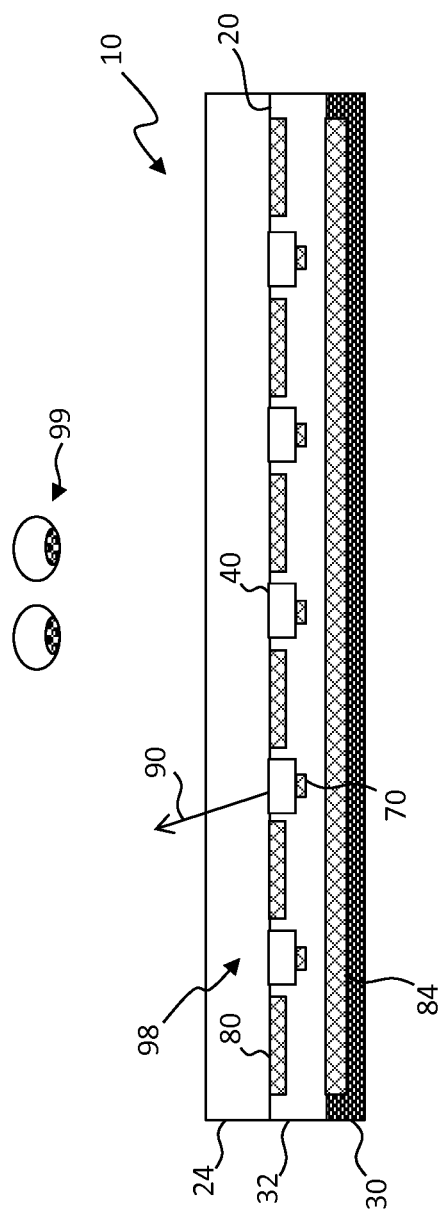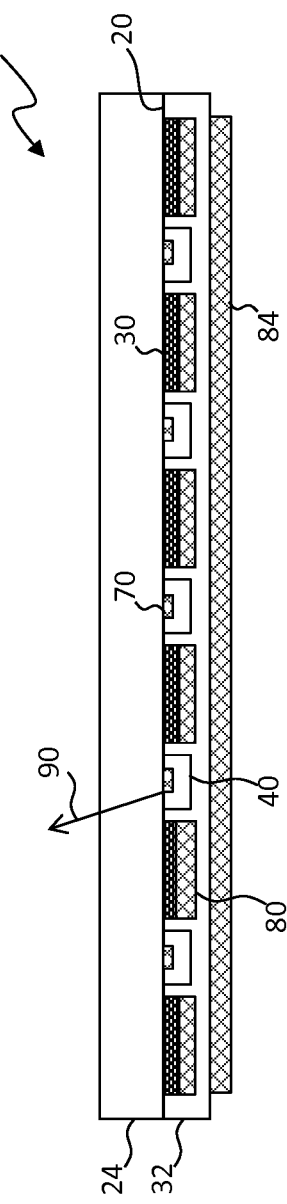

DISPLAY WITH INTEGRATED ELECTRODES

CROSS REFERENCE TO RELATED APPLICATIONS

Reference is made to commonly assigned U.S. patent application Ser. No. 14/754,573 filed Jun. 29, 2015, entitled Small-Aperture-Ratio Display with Electrical Component, U.S. patent application Ser. No. 14/823,917, filed Aug. 11, 2015, entitled Printable Component Structure with Electrical Contact, U.S. patent application Ser. No. 14/743,981, filed Jun. 18, 2015, entitled Micro Assembled Micro LED Displays and Lighting Elements, and U.S. patent application Ser. No. 14/822,868, filed Aug. 10, 2015, entitled Compound Micro-Assembly Strategies and Devices, the contents of each of which is incorporated by reference herein in its entirety.

FIELD OF THE INVENTION

The present invention relates to an inorganic light-emitting diode display having integrated electrodes useful for touch sensing.

BACKGROUND OF THE INVENTION

Flat-panel displays are widely used in conjunction with computing devices, in portable devices, and for entertainment devices such as televisions. Such displays typically employ a plurality of pixels distributed over a display substrate to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode (OLED) displays rely on passing current through a layer of organic material that glows in response to the current.

Many display systems, especially in mobile applications such as tablet computers and smartphones, include a touchscreen that responds to commands provided by touching the touchscreen. A variety of touchscreen technologies are known, for example resistive, optical, acoustic, inductive, and capacitive.

Touchscreens are typically located over a display and use separate substrates and covers. Such an arrangement adds thickness and weight to a display system and absorbs light emitted by the display. In recent years, touchscreen components have been formed on display components, for example display covers, reducing the thickness and weight of the display system. U.S. Pat. No. 8,243,027 describes a variety of touchscreen structures in a liquid crystal display having a backlight and color filters. U.S. Patent Application Publication No. 2010/0214247 discloses an array of touch elements including row and column touch electrodes forming a plurality of two-dimensionally arranged capacitive sensing units in a layer.

In general, touch screens are either single-touch or multi-touch. Single-touch systems can detect only one touch at a time, for example most resistive touchscreens are of this type. Such screens are typically simple, fast, robust, easy to use with a variety of implements, and inexpensive to control and operate. In contrast, multi-touch touchscreens, for example self-capacitive or mutual-capacitive touch sensors, can detect multiple touch points on a screen at a time but are more limited in their touch modalities, for example limited to touches with a conductive stylus, such as a human finger. Such multi-touch systems use a matrix of touch sensors and are typically controlled using a sequential matrix scanning technique. For example, a mutual-capacitance touch system includes orthogonal arrays of horizontal and vertical overlapping electrodes. At every location where the horizontal and vertical electrodes overlap, a capacitor is formed, providing a capacitive touch sensor. These multiple layers require corresponding multiple process steps and materials to manufacture and add thickness to a display system incorporating touch screens. Furthermore, the process steps can require expensive high-resolution photolithographic processes over large substrates.

There remains a need, therefore, for alternative simple and robust touchscreen and display structures at low cost.

SUMMARY OF THE INVENTION

The present invention provides an inorganic light-emitting diode (iLED) display with integrated electrodes. The iLEDs form pixels that are located over a display area of a display surface to form the display and are interconnected in rows by electrical conductors that provide power, ground, and control signals to operate the pixels in the display. Row touch electrodes are disposed in rows over the display surface in the display area between the rows of light emitters. The row touch electrodes provide at least some of the elements of a touch screen, for example the row touch electrodes of a projected mutual-capacitance touch screen. The row touch electrodes and the electrical conductors can be located in a common plane, reducing the thickness of a touch screen, since both the row touch electrodes and the iLEDs are formed in rows in the display area.

In another arrangement of the present invention, an inorganic light-emitting diode display with integrated electrodes includes a display surface having a display area and a plurality of spatially separated inorganic light-emitting diodes (iLEDs) disposed on the display surface in the display area. A plurality of row touch electrodes is disposed in rows over the display surface in the display area between the inorganic light-emitting diodes in a direction parallel to the display surface and a plurality of column touch electrodes are disposed in columns over the display surface in the display area between the inorganic light-emitting diodes in a direction parallel to the display surface. This construction eliminates the need for transparent electrodes and thereby reduces costs and increases electrode conductivity, improving the operating frequency of the electrodes and size of the touch screen.

In another embodiment of the present invention, a display with an integrated touch screen includes an array of light emitters in a display area of a display surface with one or more sensing elements of a touch screen. The sensing elements are disposed either in a common plane with the light emitters or disposed on a side of the light emitters opposite the display surface. Because the sensing elements are not located between a display viewer and the light emitters, the sensing elements, such as electrodes, do not need to be transparent. Thus, the electrodes can include opaque, highly conductive materials, for example thick metal traces rather than relatively low-conductance metal oxides such as indium tin oxide or spaced-apart micro-wires. The highly conductive electrodes have a lower capacitance and can be operated at a higher frequency, enabling faster and larger touch screens with an improved signal-to-noise ratio.

According to embodiments of the present invention, a low-aperture ratio display includes inorganic light-emitting diodes light emitters disposed on a display surface, for example on a display substrate or cover. At least a portion of the area between the light emitters is used for electrodes, for example row or column touch electrodes. Either or both of the row or column touch electrodes are in a common plane or on a common surface with the light emitters. Alternatively, either or both of the row or column touch electrodes are on layers in front of the light emitters (for example in a direction orthogonal to the display surface and toward a display viewer). In another embodiment, either or both of the row or column touch electrodes are located on layers behind the light emitter (for example in a direction orthogonal to the display surface and away from a display viewer). In yet other arrangements, different layers of electrodes are located in different layers, for example in a layer in front of the display surface and in a layer common to the light emitters, in a layer common to the light emitters and in a layer behind the display surface, or in a layer in front of the display surface and in a layer behind the light emitters.

In any of these embodiments, the electrodes are located between the light emitters in a direction parallel to the display surface and therefore do not obscure light emitted from the light emitters toward a display viewer nor does light emitted from the light emitters have to pass through the electrodes. Thus, there is no need for the electrodes to be transparent and they can therefore be made of more-conductive materials than are found in devices, such as touch screens, used with displays and found in the prior art. This structure and the materials provide the advantages of a wider selection of materials and manufacturing processes and increased conductivity. The increased conductivity enables larger devices operated at a higher frequency and with more sensitive or powerful operation since the reduction in electrical resistance enables greater currents, stronger electromagnetic fields, and an improved signal-to-noise ratio for current sensing. Moreover, structures of the present invention can be thinner and lighter than prior-art designs.

In one aspect, the disclosed technology includes a light-emitting diode display with integrated electrodes, including: a display surface having a display area; a plurality of spatially separated light-emitting diodes (LEDs) disposed in rows on the display surface in the display area, the light-emitting diodes in each row of light-emitting diodes electrically connected by one or more electrical conductors (e.g., light-emitter electrodes or pixel electrodes); and one or more row touch electrodes disposed in rows over the display surface at least partially in the display area between rows of inorganic light-emitting diodes, wherein the one or more row touch electrodes are disposed on the display surface and have a width that is larger than a length and width (e.g., and height) of the light-emitting diodes.

In certain embodiments, row touch electrodes are not above or below (e.g., in the same plane) the LEDs in a direction orthogonal to the display surface.

In certain embodiments, the one or more row touch electrodes extend across the display area.

In certain embodiments, the plurality of spatially separated LEDs comprise red light emitters emitting red light, green light emitters emitting green light, and blue light emitters emitting blue light.

In certain embodiments, the display includes a plurality of pixels, wherein: each pixel comprises a red light emitter, a green light emitter, and a blue light emitter; and the distance between any two light emitters in a respective pixel is less than the distance between adjacent pixels.

In certain embodiments, the one or more row touch electrodes are opaque.

In certain embodiments, the display includes one or more column touch electrodes disposed over the display surface in the display area, the column touch electrodes extending in a different direction (e.g., perpendicular) than the row touch electrodes.

In certain embodiments, the LEDs are disposed in columns and the column touch electrodes are disposed between the columns of LEDs in a direction parallel to the display surface.

In certain embodiments, the one or more column touch electrodes are opaque (e.g., not visually transparent).

In certain embodiments, the row touch electrodes and the column touch electrodes form a capacitive touch sensor.

In certain embodiments, the row touch electrodes and the column touch electrodes are at least partially in the same plane.

In certain embodiments, the row touch electrodes and the column touch electrodes are at least partially on a common surface.

In certain embodiments, the row touch electrodes and the column touch electrodes are at least partially disposed on the display surface.

In certain embodiments, the display includes a jumper (e.g., a micro-transfer printed jumper) electrically connecting two portions of a common column electrode.

In certain embodiments, the one or more row touch electrodes are located on a common plane with the LEDs.

In certain embodiments, the display includes a light-absorbing layer located on a common layer with the LEDs.

In certain embodiments, the display includes a light-absorbing layer located between the one or more row touch electrodes and the display surface.

In certain embodiments, each of the plurality of inorganic micro light-emitting diodes has a width from 2 to 5 µm, 5 to 10 µm, 10 to 20 µm, or 20 to 50 µm.

In certain embodiments, each of the plurality of inorganic micro light-emitting diodes has a length from 2 to 5 µm, 5 to 10 µm, 10 to 20 µm, or 20 to 50 µm.

In certain embodiments, each of the plurality of inorganic micro light-emitting diodes has a height from 2 to 5 µm, 4 to 10 µm, 10 to 20 µm, or 20 to 50 µm. In certain embodiments, a resolution of the display is 120×90, 1440× 1080, 1920×1080, 1280×720, 3840×2160, 7680×4320, or 15360×8640.

In certain embodiments, the display includes a display substrate.

In certain embodiments, the display substrate has a thickness from 5 to 10 microns, 10 to 50 microns, 50 to 100 microns, 100 to 200 microns, 200 to 500 microns, 0.5 to 1 mm, 1 mm to 5 mm, 5 mm to 10 mm, or 10 mm to 20 mm.

In certain embodiments, the display substrate is a member selected from the group consisting of polymer, plastic, resin, polyimide, PEN, PET, metal, metal foil, glass, a semiconductor, and sapphire.

In certain embodiments, the display substrate has a transparency greater than or equal to 50%, 80%, 90%, or 95% for visible light.

In certain embodiments, the display substrate has a contiguous display substrate area that includes the plurality of light-emitting diodes, each light-emitting diode of the plurality of light-emitting diodes has a light-emissive area, and the combined light-emissive areas of the plurality of light-emitting diodes is less than or equal to one-quarter of the contiguous display substrate area.

In certain embodiments, combined light-emissive areas of the plurality of light-emitting diodes is less than or equal to one eighth, one tenth, one twentieth, one fiftieth, one hundredth, one five-hundredth, one thousandth, one two-thousandth, or one ten-thousandth of the contiguous display substrate area.

In another aspect, the disclosed technology includes a display with an integrated touch screen, including: a display surface having a display area; a plurality of spatially separated light emitters disposed on the display surface in the display area; and a touch screen including one or more sensing elements, wherein the sensing elements are disposed in a common plane with the light emitters.

In certain embodiments, the sensing elements are electrodes forming capacitors.

In certain embodiments, the row touch electrodes are orthogonal to the column touch electrodes and the column touch electrodes or the row touch electrodes include at least two portions electrically connected by a jumper.

In certain embodiments, the sensing elements are not visually transparent.

In certain embodiments, the display includes a light-absorbing layer located in a common layer with the light emitters or in a layer behind the light emitters in a direction orthogonal to the display surface.

In certain embodiments, the light-absorbing layer includes optical vias in which the light emitters are disposed.

In certain embodiments, the sensing elements each include one or more sensing components and all of the sensing components are disposed in the common plane with the light emitters.

In certain embodiments, the sensing elements each include one or more sensing components and all of the sensing components are disposed on a side of the light emitters opposite the display surface in a direction orthogonal to the display surface.

In certain embodiments, the sensing elements each include two or more sensing components and at least one sensing component is disposed in the common plane with the light emitters and at least one sensing component is disposed on a side of the light emitters opposite the display surface in a direction orthogonal to the display surface.

In certain embodiments, each of the plurality of inorganic micro light-emitting diodes has a width from 2 to 5 μm, 5 to 10 μm, 10 to 20 μm, or 20 to 50 μm.

In certain embodiments, each of the plurality of inorganic micro light-emitting diodes has a length from 2 to 5 μm, 5 to 10 μm, 10 to 20 μm, or 20 to 50 μm.

In certain embodiments, each of the plurality of inorganic micro light-emitting diodes has a height from 2 to 5 μm, 4 to 10 μm, 10 to 20 μm, or 20 to 50 μm.

In certain embodiments, a resolution of the display is 120×90, 1440×1080, 1920×1080, 1280×720, 3840×2160, 7680×4320, or 15360×8640.

In certain embodiments, the display includes a display substrate.

In certain embodiments, the display substrate has a thickness from 5 to 10 microns, 10 to 50 microns, 50 to 100 microns, 100 to 200 microns, 200 to 500 microns, 0.5 to 1 mm, 1 mm to 5 mm, 5 mm to 10 mm, or 10 mm to 20 mm.

In certain embodiments, the display substrate is a member selected from the group consisting of polymer, plastic, resin, polyimide, PEN, PET, metal, metal foil, glass, a semiconductor, and sapphire.

In certain embodiments, the display substrate has a transparency greater than or equal to 50%, 80%, 90%, or 95% for visible light.

In certain embodiments, the display substrate has a contiguous display substrate area that includes the plurality of light-emitting diodes, each light-emitting diode of the plurality of light-emitting diodes has a light-emissive area, and the combined light-emissive areas of the plurality of light-emitting diodes is less than or equal to one-quarter of the contiguous display substrate area.

In certain embodiments, combined light-emissive areas of the plurality of light-emitting diodes is less than or equal to one eighth, one tenth, one twentieth, one fiftieth, one hundredth, one five-hundredth, one thousandth, one two-thousandth, or one ten-thousandth of the contiguous display substrate area.

In another aspect, the disclosed technology includes a display with an integrated touch screen, including: a display surface having a display area; a plurality of spatially separated light emitters disposed on the display surface in the display area that emit light through the display surface; and a touch screen including one or more sensing elements, wherein the sensing elements are disposed on a side of the light emitters opposite the display surface.

In certain embodiments, the sensing elements are electrodes forming capacitors.

In certain embodiments, the row touch electrodes are orthogonal to the column touch electrodes and the column touch electrodes or the row touch electrodes include at least two portions electrically connected by a jumper.

In certain embodiments, the sensing elements are not visually transparent.

In certain embodiments, the display includes a light-absorbing layer located in a common layer with the light emitters or in a layer behind the light emitters in a direction orthogonal to the display surface.

In certain embodiments, the light-absorbing layer includes optical vias in which the light emitters are disposed.

In certain embodiments, the sensing elements each include one or more sensing components and all of the sensing components are disposed in the common plane with the light emitters.

In certain embodiments, the sensing elements each include one or more sensing components and all of the sensing components are disposed on a side of the light emitters opposite the display surface in a direction orthogonal to the display surface.

In certain embodiments, the sensing elements each include two or more sensing components and at least one sensing component is disposed in the common plane with the light emitters and at least one sensing component is disposed on a side of the light emitters opposite the display surface in a direction orthogonal to the display surface.

In certain embodiments, each of the plurality of inorganic micro light-emitting diodes has a width from 2 to 5 μm, 5 to 10 μm, 10 to 20 μm, or 20 to 50 μm.

In certain embodiments, each of the plurality of inorganic micro light-emitting diodes has a length from 2 to 5 μm, 5 to 10 μm, 10 to 20 μm, or 20 to 50 μm.

In certain embodiments, each of the plurality of inorganic micro light-emitting diodes has a height from 2 to 5 μm, 4 to 10 μm, 10 to 20 μm, or 20 to 50 μm.

In certain embodiments, a resolution of the display is 120×90, 1440×1080, 1920×1080, 1280×720, 3840×2160, 7680×4320, or 15360×8640.

In certain embodiments, the display includes a display substrate.

In certain embodiments, the display substrate has a thickness from 5 to 10 microns, 10 to 50 microns, 50 to 100 microns, 100 to 200 microns, 200 to 500 microns, 0.5 to 1 mm, 1 mm to 5 mm, 5 mm to 10 mm, or 10 mm to 20 mm.

In certain embodiments, the display substrate is a member selected from the group consisting of polymer, plastic, resin, polyimide, PEN, PET, metal, metal foil, glass, a semiconductor, and sapphire.

In certain embodiments, the display substrate has a transparency greater than or equal to 50%, 80%, 90%, or 95% for visible light.

In certain embodiments, the display substrate has a contiguous display substrate area that includes the plurality of light-emitting diodes, each light-emitting diode of the plurality of light-emitting diodes has a light-emissive area, and the combined light-emissive areas of the plurality of light-emitting diodes is less than or equal to one-quarter of the contiguous display substrate area.

In certain embodiments, combined light-emissive areas of the plurality of light-emitting diodes is less than or equal to one eighth, one tenth, one twentieth, one fiftieth, one hundredth, one five-hundredth, one thousandth, one two-thousandth, or one ten-thousandth of the contiguous display substrate area.

In another aspect, the disclosed technology includes an inorganic light-emitting diode display with integrated electrodes, including: a display surface having a display area; a plurality of spatially separated light-emitting diodes (LEDs) disposed on the display surface in the display area; a plurality of row touch electrodes disposed in rows over the display surface in the display area between the light-emitting diodes; and a plurality of column touch electrodes disposed in columns over the display surface in the display area between the light-emitting diodes in a direction parallel to the display surface.

In certain embodiments, the row touch electrodes, the column touch electrodes, or both the row touch electrodes and the column touch electrodes are opaque.

In certain embodiments, the row touch electrodes, the column touch electrodes, or both the row touch electrodes and the column touch electrodes are located on a side of the iLEDs adjacent to the display surface.

In certain embodiments, the row touch electrodes and the column touch electrodes comprise a touch screen.

In certain embodiments, each of the plurality of inorganic micro light-emitting diodes has a width from 2 to 5 µm, 5 to 10 µm, 10 to 20 µm, or 20 to 50 µm.

In certain embodiments, each of the plurality of inorganic micro light-emitting diodes has a length from 2 to 5 µm, 5 to 10 µm, 10 to 20 µm, or 20 to 50 µm.

In certain embodiments, each of the plurality of inorganic micro light-emitting diodes has a height from 2 to 5 µm, 4 to 10 µm, 10 to 20 µm, or 20 to 50 µm.

In certain embodiments, a resolution of the display is 120×90, 1440×1080, 1920×1080, 1280×720, 3840×2160, 7680×4320, or 15360×8640.

In certain embodiments, the display includes a display substrate.

In certain embodiments, the display substrate has a thickness from 5 to 10 microns, 10 to 50 microns, 50 to 100 microns, 100 to 200 microns, 200 to 500 microns, 0.5 to 1 mm, 1 mm to 5 mm, 5 mm to 10 mm, or 10 mm to 20 mm.

In certain embodiments, the display substrate is a member selected from the group consisting of polymer, plastic, resin, polyimide, PEN, PET, metal, metal foil, glass, a semiconductor, and sapphire.

In certain embodiments, the display substrate has a transparency greater than or equal to 50%, 80%, 90%, or 95% for visible light.

In certain embodiments, the display substrate has a contiguous display substrate area that includes the plurality of light-emitting diodes, each light-emitting diode of the plurality of light-emitting diodes has a light-emissive area, and the combined light-emissive areas of the plurality of light-emitting diodes is less than or equal to one-quarter of the contiguous display substrate area.

In certain embodiments, combined light-emissive areas of the plurality of light-emitting diodes is less than or equal to one eighth, one tenth, one twentieth, one fiftieth, one hundredth, one five-hundredth, one thousandth, one two-thousandth, or one ten-thousandth of the contiguous display substrate area.

In certain embodiments, the display surface is formed on a display substrate or cover.

In certain embodiments, the pixels form a regular array on the display substrate.

In certain embodiments, each pixel includes a single light emitter.

In certain embodiments, each pixel includes at least three light emitters, each of the at least three light emitters emitting light of different colors.

In certain embodiments, the display includes a plurality of pixel elements including a pixel substrate (e.g., separate from the display substrate) on the display substrate and wherein each of the plurality of light emitters is located on one of the plurality of pixel elements.

In certain embodiments, one or more conductive wires electrically connect two or more of the pixel elements.

In certain embodiments, the one or more conductive wires conduct signals for controlling the pixel elements, for conducting power to the pixel elements, or for providing a ground reference voltage.

In certain embodiments, the combined light-emissive areas of the light emitters is less than or equal to one eighth, one tenth, one twentieth, one fiftieth, one hundredth, one five-hundredth, one thousandth, one two-thousandth, or one ten-thousandth of the contiguous display substrate area.

In certain embodiments, the one or more light emitters are formed in or located on the display substrate.

In certain embodiments, each light emitter is formed on a pixel substrate separate from the display substrate.

In certain embodiments, the pixel substrate is located on the display substrate.

In certain embodiments, the light emitters emit light through the display substrate.

In certain embodiments, each of the plurality of inorganic micro light-emitting diodes has a width from 2 to 5 µm, 5 to 10 µm, 10 to 20 µm, or 20 to 50 µm.

In certain embodiments, each of the plurality of inorganic micro light-emitting diodes has a length from 2 to 5 µm, 5 to 10 µm, 10 to 20 µm, or 20 to 50 µm.

In certain embodiments, each of the plurality of inorganic micro light-emitting diodes has a height from 2 to 5 µm, 4 to 10 µm, 10 to 20 µm, or 20 to 50 µm.

In certain embodiments, the display substrate is at least one of plastic, glass, and sapphire.

In certain embodiments, the display substrate is transparent to visible light.

In certain embodiments, the display substrate is at least partially transparent to visible light.

In certain embodiments, the inorganic light-emitting diode display has no less than 30 percent transparency to visible light (e.g., transparent; e.g., no less than 50%, 80%, 90%, or 95% transparency to visible light).

In certain embodiments, each pixel includes: a printed pixel element of a plurality of printed pixel elements disposed on the display substrate, each printed pixel element of the plurality of printed pixel elements including: a pixel substrate of a plurality of pixel substrates on which the micro inorganic light-emitting diodes for a respective pixel are disposed, and a fine interconnection having a width of 100 nm to 1 µm electrically connected to the micro inorganic light-emitting diodes for the respective pixel.

In certain embodiments, the display includes one or more crude lithography interconnections having a width from 2 µm to 2 mm, wherein each crude lithography interconnection is electrically connected to at least one of the plurality of pixel elements on the display substrate.

In certain embodiments, the plurality of light emitters includes a plurality of yellow printed micro inorganic light-emitting diodes that emit yellow light, and wherein each pixel of the plurality of pixels includes a yellow printed micro inorganic light-emitting diode of the plurality of yellow printed micro inorganic light-emitting diodes that emit yellow light.

In certain embodiments, the plurality of pixels forms an array on the display substrate.

In certain embodiments, the plurality of light emitters emits light through the display substrate.

In certain embodiments, the display includes a plurality of active electrical components disposed on the display substrate, each of said active electrical components electrically connected to one or more light emitters of a respective pixel.

In certain embodiments, the display includes micro transfer printing a plurality of active electrical components on the display substrate, and electrically connecting each of said active electrical components to a respective one or more micro inorganic light-emitting diodes of a respective pixel.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 4-11 are cross sections of various embodiments of the present invention having row and column touch electrodes in a common plane;

Figure 1:
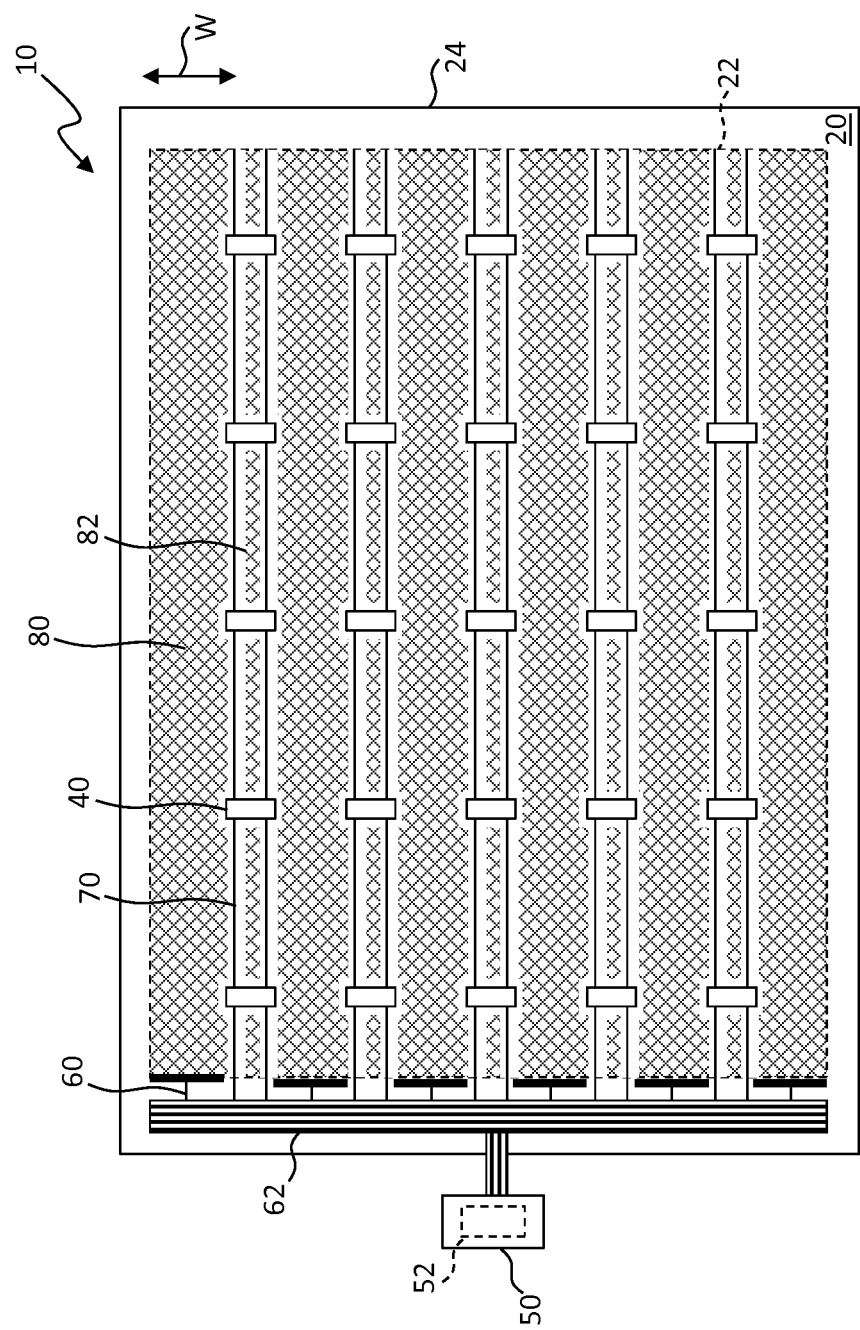
FIGS. 1-3 are plan views of various embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Referring to FIG. 1, in an embodiment of the present invention, a light-emitting diode display 10 with integrated touch electrodes 80 includes a display surface 20 having a display area 22. The display surface 20 can be a surface of a display substrate 24 and the display area 22 is the portion of the display surface 20 that is used to electronically display information for viewing by a display viewer (e.g. display viewer 99, FIG. 4). A plurality of spatially separated light-emitting diodes (LEDs) 40 is disposed in rows on or in the display surface 20 in the display area 22, for example in a direction parallel to the display surface 20. The light-emitting diodes 40 can be organic light-emitting diodes, inorganic light-emitting diodes, or a combination of organic and inorganic light-emitting diodes. In an embodiment, all of the light-emitting diodes 40 are inorganic light-emitting diodes. The light-emitting diodes 40 in each row of light-emitting diodes 40 are electrically connected by one or more electrical conductors 70, for example wires. In the example shown in FIG. 1, the light-emitting diodes 40 in each row are electrically connected by two electrical conductors 70. The touch electrodes 80 are described as touch electrodes 80 herein to distinguish them from the electrical conductors 70, which are sometimes known in the art as light-emitter electrodes or pixel electrodes. One or more row touch electrodes 80 are disposed in rows over the display surface 20 at least partially in the display area 22 between the rows of inorganic light-emitting diodes 40, for example in a direction parallel to the display surface 20. The one or more row touch electrodes 80 each have a width W that is larger than a length and width of the light-emitting diodes. As intended herein, each row touch electrode 80 extends along a length over the display surface 20 and has a width W orthogonal to the length that is less than the length.

In an embodiment, the light-emitting diodes 40 are inorganic micro-LEDs 40. By referring to an LED as a micro-LED 40 is meant that the micro-LED 40 is too small to be directly observed or resolved by a display viewer 99 at the designed viewing distance. As used herein, the micro-LEDs 40 are also inorganic light-emitting diodes (iLEDs) referred to either as micro-LEDs 40 or iLEDs 40 or more generally as light emitters 40. The display surface 20 can be the surface of a display substrate 24, for example made of glass, ceramic, or plastic having opposing surfaces suitable for photolithographic materials and processes or for micro transfer printing. Alternatively, the display surface 20 can be the surface of a removable layer on which the micro-LEDs 40 are disposed and which is subsequently removed from the micro-LEDs 40.

The row touch electrodes 80 can be located on the display surface 20, for example between the rows of micro-LEDs 40, and can extend across the display area 22, as shown in FIG. 1. Similarly, the electrical conductors 70 can be located on or in the display surface 20, for example between the micro-LEDs 40 in a row of micro-LEDs, as shown in FIG. 1.

In certain embodiments, the electrical conductors 70, row touch electrodes 80, or both the electrical conductors 70 and row touch electrodes 80 are located behind the display surface 20 in a direction orthogonal to the display surface 20 and opposite a viewing side (98, FIG. 4) from which the display surface 20 is viewed by a display viewer 99. Because the electrical conductors 70 and/or row touch electrodes 80 are not between a display viewer 99 and the micro-LEDs 40, light emitted by the micro-LEDs 40 is not obscured, absorbed, or patterned by the electrical conductors 70 and/or row touch electrodes 80. Therefore, the electrical conductors 70 and/or row touch electrodes 80 can be larger, thicker, opaque, and/or have a much higher conductivity than is available using transparent metal oxides or a metal mesh. As intended herein, an opaque touch electrode 80 is one that is not visually transparent, for example having a transparency less than 50%, less than 25%, less than 10%, or less than 1% transparent to electromagnetic radiation in the visible spectrum.

In certain embodiments, the electrical conductors 70, row touch electrodes 80, or both the electrical conductors 70 and the row touch electrodes 80 are patterned metal traces and have a thickness greater than 0.5 microns, one micron, two microns, five microns, ten microns, 20 microns, or 50 microns. The electrical conductors 70 or row touch electrodes 80, or both, can be opaque, highly conductive, and arranged in dense configurations that are large enough to be visible to the human visual system. For example, the electrical conductors 70 and/or row touch electrodes 80 can have a conductance of less than one ohm per square, less than 0.1 ohms per square, less than 0.01 ohms per square, less than 0.001 ohms per square, or less than 0.0001, 0.00001, or 0.000001 ohms per square. Such large, highly conductive electrical conductors 70 and/or row touch electrodes 80 can enhance performance by reducing resistance, for example by increasing the frequency at which signals can propagate in the electrical conductors 70 and row touch electrodes 80 and by reducing ohmic losses, thereby improving power efficiency. Thus, the LED display 10 of the present invention provides superior light emission, visual appearance, and electrical performance than displays with touch screens of the prior art. The LED display 10 of the present invention is also useful for larger displays, for example having a diagonal measurement of 50 cm, 1 m, 2 m, 3 m, 4 m, or larger.

In certain embodiments, the electrical conductors 70, row touch electrodes 80, or both the electrical conductors 70 and row touch electrodes 80 are or include transparent conductive oxides such as metal oxides, or metal meshes. Transparent conductive oxides, such as indium tin oxide or aluminum zinc oxide, can have a transparency greater than 80% to visible light. As intended herein, metal mesh electrodes, for example having micro-wires with a width of 20 microns, 10 microns, 5 microns, two microns, or one micron or less when arranged in a mesh configuration with a fill factor less than 10% (for example with a micro-wire pitch of 50 microns 100 microns, 250 microns, or 500 microns or greater) are considered to be transparent since the micro-wires of the mesh are not readily distinguishable by the human visual system and the overall transparency to visible light is 90% or more. In contrast, opaque wires useful in certain embodiments of the present invention can have a width greater than 10, 20, 50, 100, 500, 1000, 2000, 4000, or 5000 microns. For example, touch screens described herein can include touch electrodes 80 at a 4 mm pitch.

The controller 50 can be an integrated circuit and can be connected to the LED display 10 through, for example wires 60 arranged in, or separate from, a bus 62 and can be located external to the LED display 10, as shown in FIG. 1. Alternatively, the controller 50 can be located on a substrate or cover of the LED display 10 outside of the display area 22 (not shown).

The controller 50 can include a controller circuit 52 that provides control signals to the LED display 10, as well as power and ground signals. The signals are electrically conducted through the electrical conductors 70 to the LEDs, causing them to emit light. Separately the control circuit 52 can provide signals to the touch electrodes 80 to detect touches on or near the LED display 10. By sequentially energizing the row touch electrodes 80 and sensing the capacitance of each of the column touch electrodes (e.g., column touch electrodes 84 in FIG. 3), or vice versa, touches can be detected.

Dummy wires 82 (also known in the art as dummy electrodes) similar to those used in the touch electrodes 80 but that are electrically isolated from the touch electrodes 80 can be used between the electrical conductors 70 to enhance the optical uniformity of the LED display 10 of the present invention. The dummy wires 82 can be made in a common step and with common materials as the row touch electrodes 80. Alternatively, wires similar to the electrical conductors 70 can be used to provide optical uniformity. In yet another embodiment, the electrical conductors 70 can also be made in a common step and with common materials as the row touch electrodes 80 or dummy wires 82.

Figure 2:
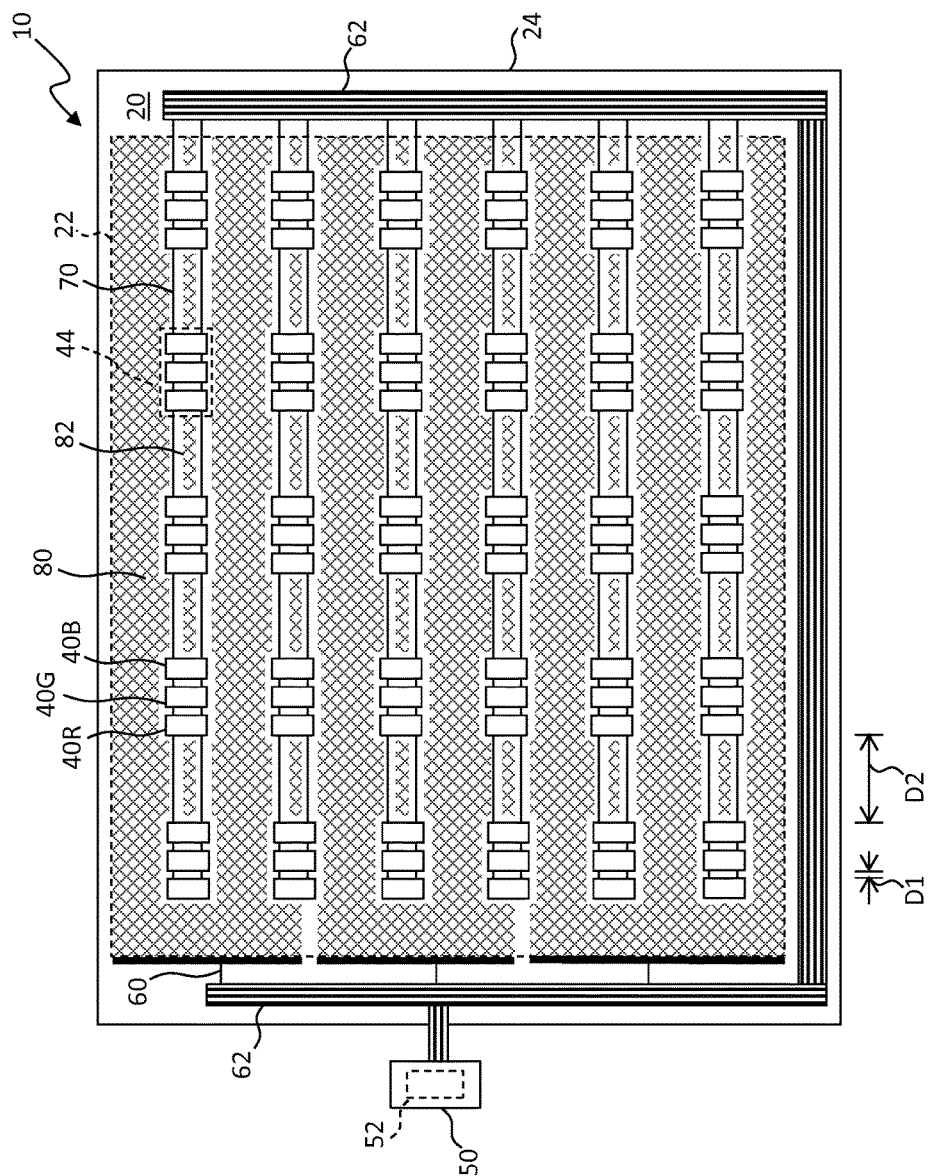

In certain embodiments as shown in FIG. 2, the plurality of micro-LEDs 40 can include red micro-LEDs 40R that emit red light, green micro-LEDs 40G that emit green light, and blue micro-LEDs 40B that emit blue light (collectively micro-LEDs 40). The red, green, and blue micro-LEDs 40R, 40G, 40B can be arranged in any of a variety of ways, for example in rows as shown in FIG. 2 with each red micro-LED 40R between a green micro-LED 40G and a blue micro-LED 40B in a common row. In certain embodiments, the micro-LEDs 40 are arranged in pixel groups 44, each of which has one red, one green, and one blue micro-LED 40R, 40G, 40B forming a pixel. The micro-LEDs 40 within a pixel group 44 can be spatially separated by a distance D1 that is less than the distance D2 between the pixel groups 44, thereby enhancing visual color mixing of the individual pixel groups 44. As shown in FIG. 1, the light emitters 40 form a regular array on the display surface 20. As shown in FIG. 2, the pixel groups 44 form a regular array on the display surface 20. Alternatively, at least some of the pixel groups 44 or light emitters 40 have an irregular arrangement on the display surface 20 (not shown).

As shown in FIG. 2, each row touch electrode 80 extends along opposite sides of a single row of micro-LEDs 40 forming a wider row touch electrode 80 having a spatial resolution that is less than the spatial resolution of the rows of micro-LEDs 40. For example, using these wider electrodes, the resulting touch screen can be formed with electrodes formed at, for example, a 4 mm pitch, while the light emitters can be disposed at a pitch of 100 microns. Such a structure can also be constructed by electrically connecting touch electrodes 80 located on either side of one or more rows of micro-LEDs 40. For example, two or more touch electrodes 80 shown in FIG. 1 can be electrically connected to form a structure operationally equivalent to the structure shown in FIG. 2. The touch electrodes 80 can be electrically connected outside the display area 22, for example by using low-resolution screen printing processes and materials and employing multi-level connections (as can be done with the configuration of FIG. 1) or can be electrically connected within the display area 22. Alternatively, as in FIG. 2, the electrical conductors 70 can be connected to a bus 62 on a different side of the display area 22 than the touch electrodes 80, and the touch electrodes 80 can be electrically connected between the last micro-LEDs 40 in a row and the edge of the display area 22. In yet another alternative, multiple layers of electrical connections can be formed in the display area 22 to electrically connect the touch electrodes 80 in whatever way is desired (not shown). Alternatively, as shown in FIG. 2, a single row touch electrode 80 can be considered to be located between multiple rows of iLEDs 40.

Figure 3:
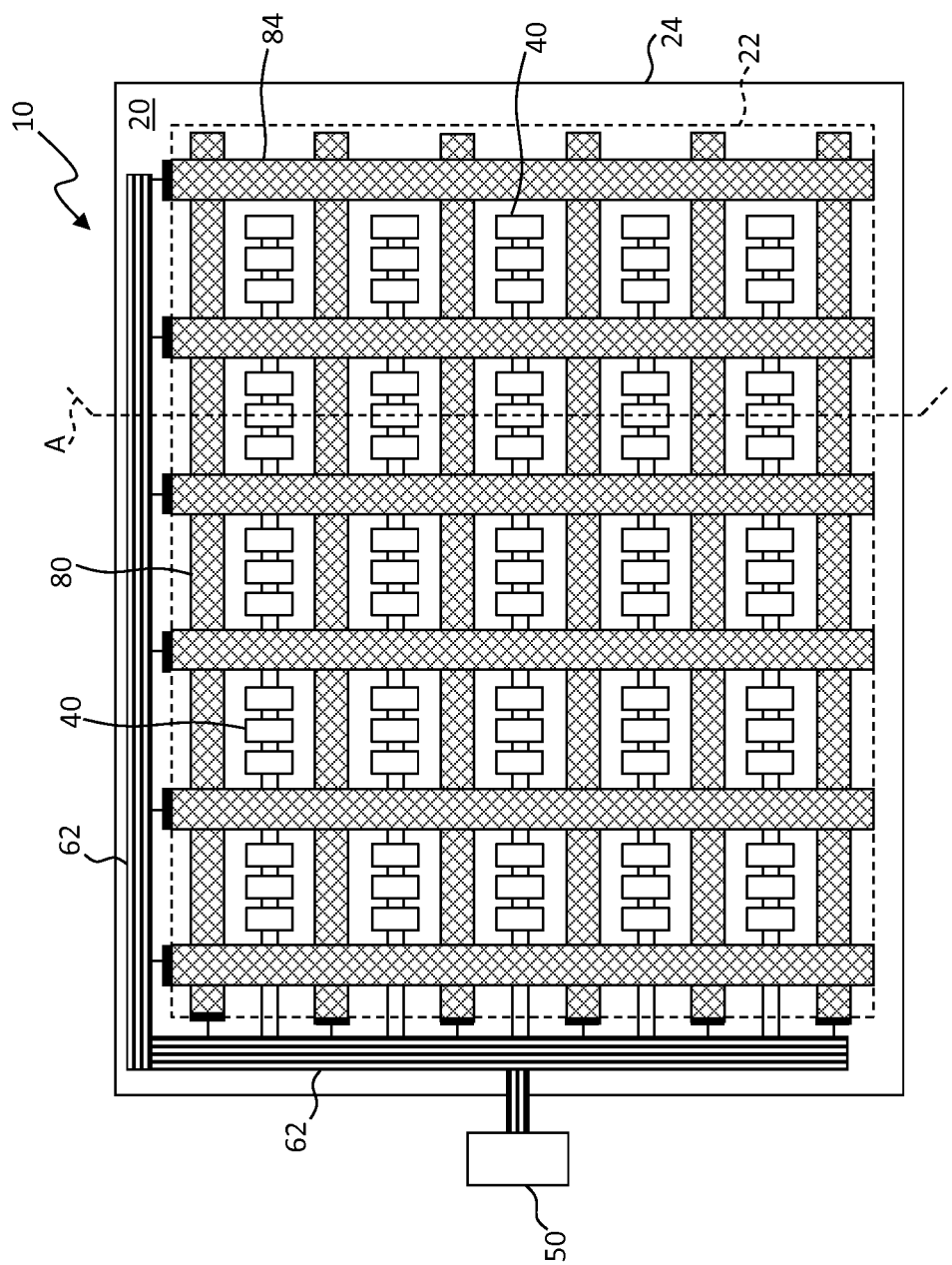

Referring next to FIG. 3, a light-emitting diode display 10 of the present invention can include one or more column touch electrodes 84 disposed over and in a direction parallel to the display surface 20 in the display area 22. The column touch electrodes 84 extend in a different direction in the display area 22 than the row touch electrodes 80, for example in an orthogonal direction and can be located between columns of iLEDs in a direction parallel to the display surface 20. Thus, neither the row touch electrodes 80 nor the column touch electrodes 84 obscure light emitted from the iLEDs toward a display viewer 99 in a direction that is not parallel to the display surface 20. The row and column touch electrodes 80, 84 can overlap to form capacitors in a capacitive touch sensor. According to the present invention, however, and contrary to the prior art, the one or more column touch electrodes 84 can be similar to the row touch electrodes 80, opaque, and not visually transparent so that the capacitors can likewise be solid and opaque. In an embodiment, the row or column touch electrodes 80, 84, or both, are a solid metal that is not a mesh and is not a transparent conductive oxide. In FIG. 3, the micro-LEDs 40 are illustrated as relatively large emitters for clarity. In practice the row and column touch electrodes 80, 84 are much larger (for example hundreds of microns wide) than the micro-LEDs 40 (for example ones or tens of microns wide or long).

Figure 14:
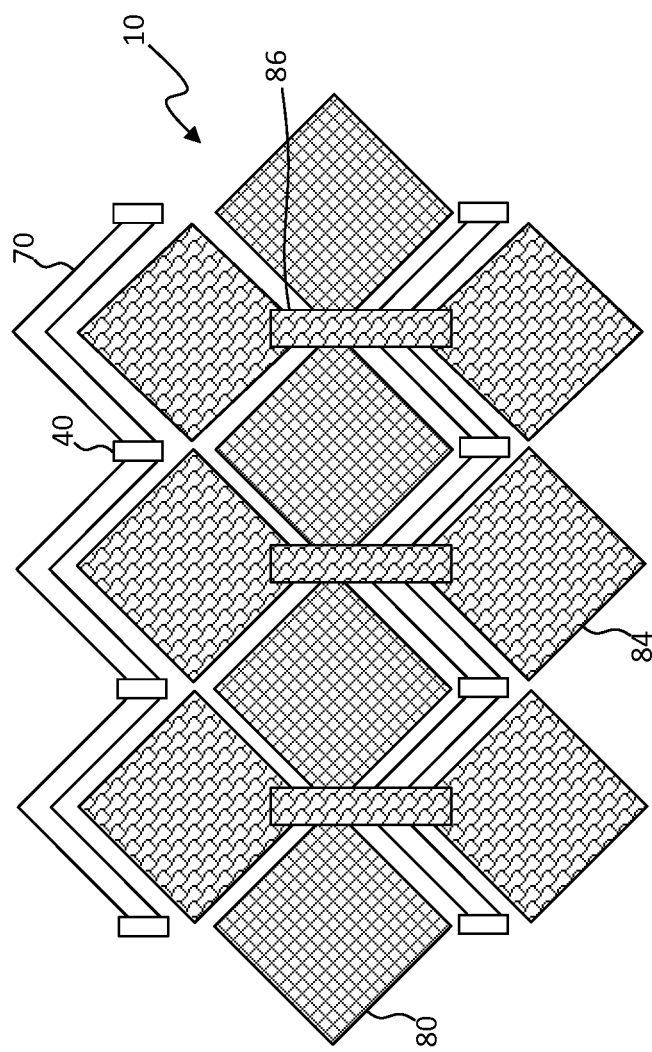
FIG. 14 is a plan view of an embodiment of the present invention with row and column touch electrodes in a common plane or on a common surface.

In one embodiment of the present invention, the row touch electrodes 80 and the column touch electrodes 84 are at least partially in the same plane or on or in a common surface, for example as described below with respect to FIG. 14. The common surface can be the display surface 20 and can be the same surface as that on which the micro-LEDs 40 are disposed. In alternative embodiments, the row touch electrodes 80 and the column touch electrodes 84 are in different planes or formed or located on different planes or surfaces. One of the different planes or surfaces can be the display surface 20 for either the row or column touch electrodes 80, 84. One or both of the different planes or surfaces on which the row or column touch electrodes 80, 84 are formed or located can be in front of the display surface 20 (e.g., in a location between a display viewer 99 and the display surface 20) or can be behind the display surface 20 (e.g., the display surface 20 is located between the row or column touch electrodes 80, 84 and a display viewer 99 in a direction that is not parallel to the display surface 20).

The cross sections of FIGS. 4-11 illustrate a variety of embodiments of the present invention. The cross sections are taken across cross section line A of FIG. 3, with additional elements included for illustration (in particular the column touch electrode 84). Referring to FIG. 4, in an embodiment of the present invention, the display substrate 24 has a display surface 20 on which is disposed a plurality of spatially separated inorganic light-emitting diodes (iLEDs) in an array with rows. The electrical conductors 70 electrically connect the micro-LEDs 40 and can be photolithographically formed after the micro-LEDs 40 are disposed on the display surface 20. Row touch electrodes 80 are located on the same display surface 20 and are thus in a common plane and on a common surface with the micro-LEDs 40. An insulating layer 32 is formed on the display surface 20, the row touch electrodes 80, and the micro-LEDs 40. An array of column touch electrodes 84 is disposed on the insulating layer 32 behind the row touch electrodes 80 as viewed by a display viewer 99. The insulating layer 32 allows electromagnetic fields to permeate or pass through the light-absorbing insulating layer 32 without being electrically shorted. In certain embodiments, an optional light-absorbing layer 30 is on the column touch electrodes 84 and the insulating layer 32. (The column touch electrode 84 is illustrated in FIG. 4 but is not actually in the cross section line A of FIG. 3. As shown in FIGS. 4-9, described further below, the column touch electrodes 84 extend behind and could extend under the micro-LEDs 40 but are shown between and in front of the micro-LEDs 40 for clarity in FIG. 3.) The light-absorbing layer 30 absorbs ambient light and thereby improves the contrast of the LED display 10.

Figure 6:
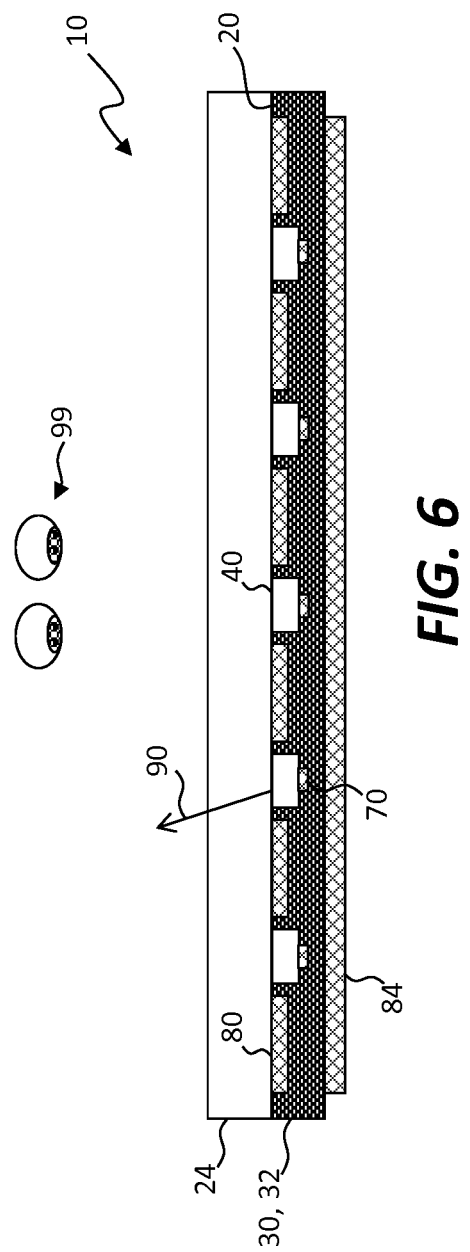

In certain embodiments as shown in FIG. 6, the insulating layer 32 is light absorbing so that the light-absorbing layer 30 is at least partly in a common layer or plane with the micro-LEDs 40, for example on the display surface 20.

Referring to FIG. 5, the light-absorbing layer 30 is patterned on the display surface 20 so as to cover the display surface 20 except in the locations where the micro-LEDs 40 are located on the display surface 20. In this embodiment, the electrical conductors 70 are photolithographically formed before the micro-LEDs 40 are disposed on the display surface 20. The light-absorbing layer 30 is in a common plane with or on a common surface with the micro-LEDs 40. The row touch electrodes 80 are formed or located on the light-absorbing layer 30. As intended herein, the row touch electrodes 80 are disposed on the display surface 20 when they are disposed on the light-absorbing layer 30 between the micro-LEDs 40 in a direction parallel to the display surface 20 and the light-absorbing layer 30 is on or in physical contact with the display surface 20. Alternatively, the portions of the light-absorbing layer 30 between the micro-LEDs 40 in a direction parallel to the display surface 20 are a part of the row touch electrodes 80 so that the row touch electrodes 80 are disposed on the display surface 20. The insulating layer 32 (which can be light absorbing) is located on the micro-LEDs 40 and row touch electrodes 80, and the column touch electrodes 84 are on the insulating layer 32, as in FIG. 4.

FIG. 6 illustrates the case in which the insulating layer 32 is also a light-absorbing layer 30. In FIGS. 4-6, light 90 emitted from the micro-LEDs 40 can pass through the display surface 20 and display substrate 24 to a display viewer 99. In FIGS. 4 and 6, the light-absorbing layer 30 is not patterned. In FIG. 5, the light-absorbing layer 30 is patterned.

Figure 7:
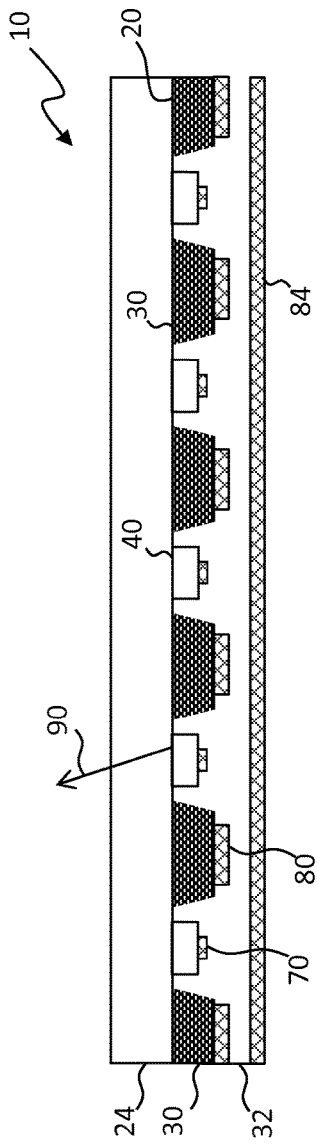

As shown in FIG. 7, a light-absorbing layer 30 that is thicker than the light-absorbing layer 30 of FIG. 5 and that locates the row touch electrodes 80 further from the display surface than the micro-LEDs 40 can be employed to absorb ambient light. An interlayer dielectric (not shown) can be used over the light-absorbing layer 30 to electrically insulate the row touch electrodes 80 from each other, the electrical conductors 70, and the micro-LEDs 40 if the light-absorbing layer 30 is electrically conductive or partially electrically conductive, for example having a high resistance (a dielectric layer can also be used in the embodiments of FIG. 4-6).

Figure 8:
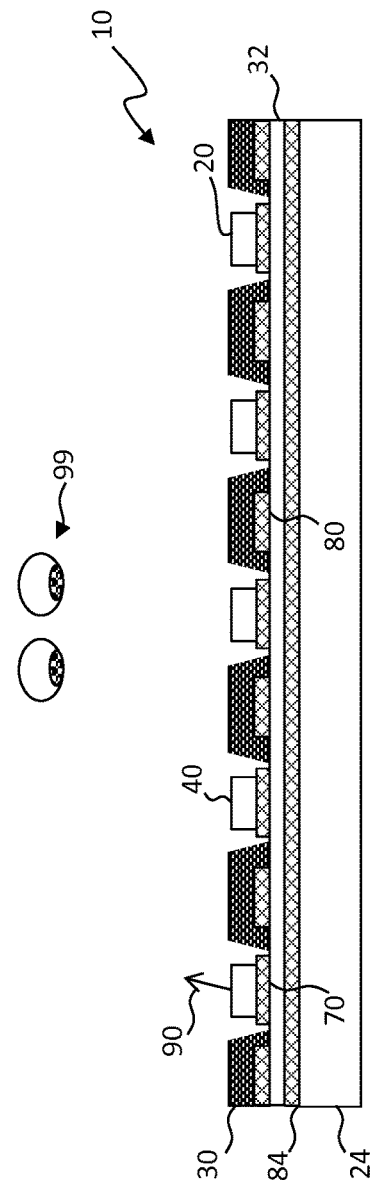
Figure 9:
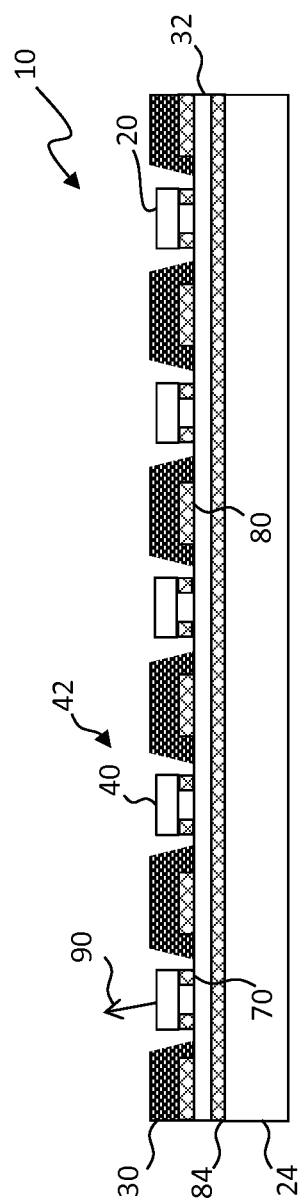

The embodiments of FIGS. 4-7 can be considered to be bottom-emitting configurations since the micro-LEDs 40 emit light through the display substrate 24. In the alternative top-emitter configuration of FIG. 8, the micro-LEDs 40 emit light 90 in a direction opposite the display substrate 24 toward a display viewer 99. The electrical conductors 70 are formed on the display surface 20 before the micro-LEDs 40 are disposed on the display surface 20, as in FIG. 5 and in contrast to FIGS. 4, 6, and 7. Electrical connections between the electrical conductors 70 and the micro-LEDs 40, for example with a contact pad, can be made mechanically or with a reflowable conductive material such as a solder patterned on the contact pad or at least a portion of the electrical conductors 70. As shown in the top emitter configuration shown in FIG. 9, a plurality of electrical conductors 70 are associated with each micro-LED 40. Although the electrical conductors 70 are illustrated as between the micro-LEDs 40 and the insulating layer 32, the micro-LEDs 40 are considered to be disposed on the insulating layer 32. As shown in FIGS. 8 and 9, the display surface 20 is the light-emitting surface of the micro-LEDs 40. In an alternative embodiment and understanding (not shown), the display surface 20 is the surface of the insulating layer 32.

In various embodiments, the light emitter 40 is at least a part of a structure that includes a pixel substrate separate and independent from the display substrate 24 and that can include multiple light emitters 40 (e.g. red, green, and blue micro-LEDs 40R, 40G, 40B, not shown) to form a pixel element 42 that is transfer printed to the display substrate 24 or a layer (e.g. insulating layer 32) on the display substrate 24. Such a pixel element 42 can be made using multi-step transfer or assembly process techniques such as compound micro assembly, for example as referenced below.

Figure 10:
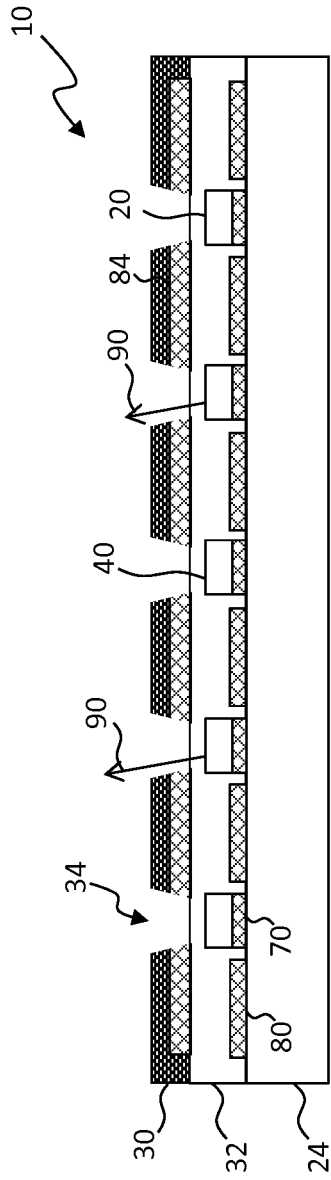
Figure 11:
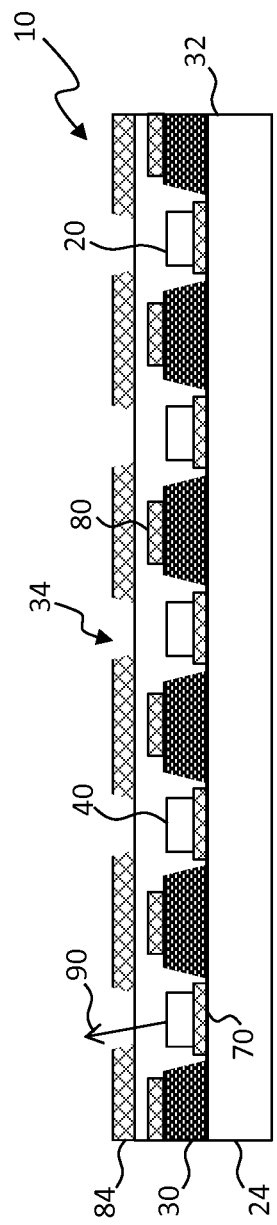

In all of FIGS. 4-9, the light-absorbing layer 30 is in the same plane as, on a common surface with, or behind the micro-LEDs 40 and the display surface 20. Moreover, the column touch electrode 84 is behind the display surface 20 and the light-emitting micro-LEDs 40. In certain embodiments as shown in FIG. 10, the column touch electrode 84 is on a side of the light-emitting micro-LEDs 40 opposite the display substrate 24. The light-absorbing layer 30 is located on a side of the column touch electrode 84 opposite the light-emitting micro-LEDs 40. Optical vias 34 formed in the insulating layer 32 and column touch electrode 84 (if they are not already transparent) and in the light-absorbing layer 30 allow light emitted by the micro-LEDs 40 to escape from the LED display 10. In the embodiment of FIG. 11, the light-absorbing layer 30 is located in a common plane or on a common surface with micro-LEDs 40, the light-absorbing layer 30 is located between the one or more row touch electrodes 80 and the display surface 20, and the column touch electrode 84 is located on a side of the micro-LEDs 40 opposite the display substrate 24. In the embodiment of FIG. 11, the row and column touch electrodes 80, 84 are both between a display viewer 99 (in the direction of light emission), and the light-emitting micro-LEDs 40. Thus, the row touch electrodes 80 are located on a side of the micro-LEDs 40 opposite the display surface 20 in a direction orthogonal to the display surface 20.

Figure 12:
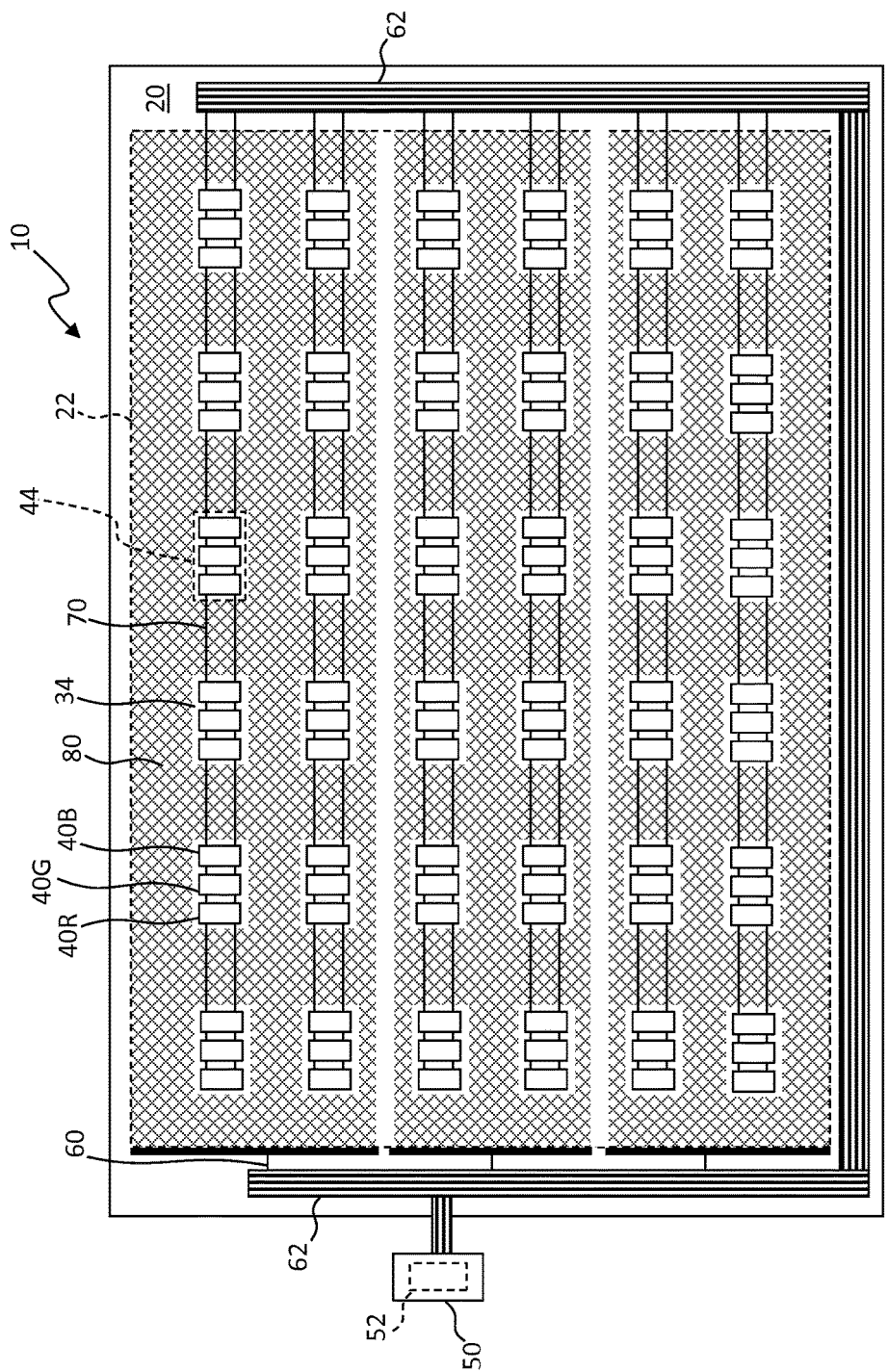
FIGS. 12 and 13 are plan views of different electrode layers in an embodiment of the present invention.
Figure 13:
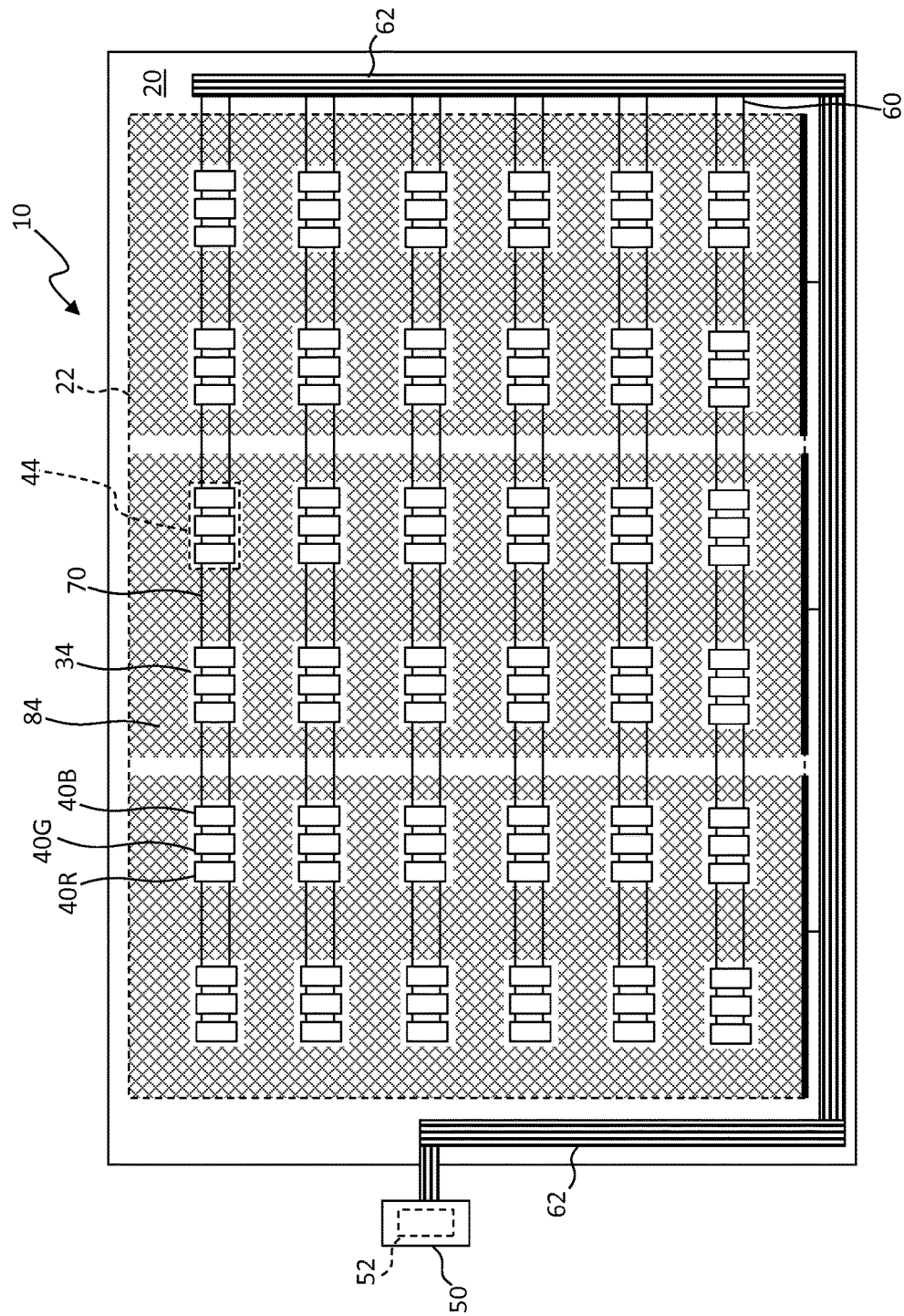

FIGS. 12 and 13 are plan views of embodiments of the present invention shown in FIGS. 10 and 11 (omitting the light-absorbing layer 30 from the illustrations) that illustrate the row touch electrodes 80 and micro-LEDs 40 (FIG. 12) and the column touch electrodes 84 and micro-LEDs 40 (FIG. 13). As shown in FIG. 12, the touch electrodes 80 form row touch electrodes 80 that substantially cover the display surface 20 except for the optical vias 34 through which light is emitted by the micro-LEDs 40. As shown in FIG. 12, the colored red, green, and blue micro-LEDs 40R, 40G, 40B are grouped together in pixel groups 44 and emit light through a common optical via 34. In another embodiment (not shown), each of the red, green, and blue micro-LEDs 40R, 40G, 40B have a separate optical via 34. The micro-iLEDs 40 are disposed in rows and the row touch electrodes 80 are disposed between the rows of micro-iLEDs 40. For clarity, FIG. 12 omits the column touch electrode 84 layer. As shown in FIG. 13, the column touch electrodes 84 form column touch electrodes 84 that also substantially cover the display surface 20 except for the optical vias 34 through which light is emitted by the micro-LEDs 40. The micro-iLEDs 40 are disposed in columns and the column touch electrodes 84 are disposed between the columns of micro-iLEDs 40. In FIG. 13, the column touch electrodes 84 obscure the row touch electrodes 80 so that the row touch electrodes 80 are not illustrated in FIG. 13. Thus, the row and column touch electrodes 80, 84 can effectively cover the display surface 20 to detect touches on or near the display surface 20 in the display area 22. Optical vias 34 are necessary when either the row and column touch electrodes 80, 84 are between the light-emitting micro-LEDs 40 and a display viewer 99 in the direction of light emission. Optical vias 34 are not necessary for any of the row and column touch electrodes 80, 84 that are not between the light-emitting micro-LEDs 40 and a display viewer 99 in the direction of light emission.

In the embodiments of FIGS. 4-13, the row and column touch electrodes 80, 84 are in different planes or on different surfaces. Referring to FIG. 14, in an alternative embodiment, both the row and column touch electrodes 80, 84 are in a common plane or on or in a common surface, for example arranged in an alternating diamond pattern. Each diamond of the row touch electrodes 80 is electrically continuous in the plane or on the surface but, to avoid shorting the row and column touch electrodes 80, 84 together, electrical jumpers 86 electrically connect two portions of a common column touch electrode 84 and provide electrical continuity to the column touch electrodes 84. For example, micro transfer printed electrical jumpers are taught in U.S. patent application Ser. No. 14/823,917, filed Aug. 11, 2015, entitled Printable Component Structure with Electrical Contact, which is incorporated in its entirety by reference. As shown in FIG. 14, the electrical conductors 70 can be located between the rows of touch electrodes 80 and can have a zig-zag pattern to complement the outline of the row touch electrodes 80. The light emitters 40 are between the rows of touch electrodes 80 and also form a row, although, in an embodiment, they could also have a zig-zag disposition.

According to a further embodiment of the present invention, a display with an integrated touch screen includes a display surface 20 having a display area 22. A plurality of spatially separated light emitters 40 are disposed on the display surface 20 in the display area 22. A touch screen includes one or more sensing elements disposed in a common plane with the light emitters 40 or on a side of the light emitters 40 opposite the display surface 20. The sensing elements physically sense touches and physically respond to the presence of a touching implement as opposed, for example to an analysis circuit. The sensing elements can be electrodes forming capacitors, for example drive or sense electrodes corresponding to either of the row or column touch electrodes 80, 84 in a capacitive touch screen. The sensing elements can include an array of row touch electrodes 80 orthogonal to an array of touch column touch electrodes 84. The column touch electrodes 84 each include at least two portions electrically connected by a jumper 86. In further embodiments, the sensing elements are not visually transparent. In other embodiments, a light-absorbing layer 30 is located in a common layer with the light emitters 40 or in a layer behind the light emitters 40 in a direction orthogonal to the display surface 20. The light-absorbing layer 30 can include optical vias 34 in which the light emitters 40 are disposed. In an embodiment, the sensing elements each include one or more sensing components and all of the sensing components are disposed in the common plane with the light emitters 40. For example, a sensing component can be an array of row touch electrodes 80 or an array of column touch electrodes 84. Alternatively, all of the sensing components are disposed on a side of the light emitters 40 opposite the display surface 20 in a direction orthogonal to the display surface 20, that is behind the display surface 20 from a viewing direction. In another arrangement, at least one sensing component is disposed in the common plane with the light emitters 40 and at least one sensing component is disposed on a side of the light emitters 40 opposite the display surface 20 in a direction orthogonal to the display surface 20, that is behind the display surface 20 from a viewing direction.

In another embodiment of the present invention, a light-emitting diode display 10 with integrated electrodes includes a display surface 20 having a display area 22. A plurality of spatially separated light-emitting diodes (LEDs) 40 are disposed on the display surface 20 in the display area 22. A plurality of row touch electrodes 80 are disposed in rows over the display surface 20 in the display area 22 between the inorganic light-emitting diodes 40 in a direction parallel to the display surface 20. A plurality of column touch electrodes 84 are disposed in columns over the display surface 20 in the display area 22 between the inorganic light-emitting diodes 40 in a direction parallel to the display surface 20. In various embodiments, the row touch electrodes 80, the column touch electrodes 84, or both the row touch electrodes 80 and the column touch electrodes 84 are opaque. The row touch electrodes 80, the column touch electrodes 84, or both the row touch electrodes 80 and the column touch electrodes 84 can be located on a side of the LEDs 40 adjacent to the display surface 20 or opposite the display surface 20 in a direction orthogonal to the display surface 20. Thus, both the row and column touch electrodes 80, 84 or either of the row and column touch electrodes 80, 84 can be in a same plane with the light emitters 40, in front of the light emitters 40, or behind the light emitters 40 where in front of means between a display viewer 99 and the light emitters 40 and behind means on an opposite side of the light emitters 40 from a display viewer 99. The row and column touch electrodes 80, 84 can comprise a touch screen.

In all of these embodiments, because the row and column touch electrodes 80, 84 do not need to be transparent, they can be more conductive, carry more current, have a smaller impedance, and can create larger electromagnetic fields at a higher frequency. They can also be more sensitive to current and provide an increased signal-to-noise ratio. Therefore, the present invention enables touch detection with a column touch electrode 84 behind the light-emitting micro-LEDs 40 or a light-absorbing layer 30 between one or both of the row and column touch electrodes 80, 84. This enables a simpler structure with fewer layers and improved light emission and touch detection.

In one embodiment of the present invention, the light-emitting micro-LEDs 40 are connected in rows and columns and are controlled through row and column drivers providing matrix addressing of the light emitters 40. In such an embodiment, the electrical conductors 70 can be formed in a different plane or on a different surface than the row or column touch electrodes 80, 84, or electrical jumpers 86 can be used to electrically isolate the electrical conductors 70 from the row and column touch electrodes 80, 84. Such a display can be operated by providing using the controller 50 to provide data along column connections (in a column driver) and row select signals (in a row driver) to store the data (in an active-matrix configuration) or emit light (in a passive-matrix configuration). At the same time the controller 50 can control the row and column touch electrodes 80, 84 to detect touches. Either the row or column touch electrodes 80, 84 can be a drive or sense electrode in a capacitive touch screen.

In an alternative embodiment, the electrical conductors 70 can be formed in a common plane or on a common surface with either the row or column touch electrodes 80, 84. In such an embodiment, matrix addressing is difficult. Thus, according to an embodiment of the present invention, the light emitters 40 in a row are provided in serially connected chiplets that include pixel value storage for controlling light output from the light emitters 40, for example using capacitors in an analog shift register or flip flops in a digital shift register. The shift register is distributed among the chiplets and data is then shifted through the serial shift registers and, once loaded, can be used to control light output from the light emitters 40. Such a display can be operated by providing using the controller 50 to serially shift data along row connections to store the data in each row and then enable the light emitters to emit light. At the same time, the controller 50 can control the row and column touch electrodes 80, 84 to detect touches.

The present invention can be constructed using integrated circuit and printed circuit board methods, materials, and processes. The micro-LEDs 40 can be made using semiconductor materials, integrated circuit materials and processes, and micro transfer materials and printing processes. Electrical conductors 70 and micro-wires or transparent metal oxides useful for row and column touch electrodes 80, 84 can be made using photolithographic processes with metal or metal oxides, or using metal mesh technologies including conductive inks, imprinting, printing, electroplating, or inkjet deposition. Controller 50 can be made in an integrated circuit and connected to the LED display 10 using ribbon cables, flex connectors, and the like or controller 50 can be located on a display substrate 24 or cover. Display substrates 24 and covers are available. The micro-LEDs 40 can be disposed on the display substrate 24, insulating layer 32, or light-absorbing layer 30 using printing methods such as micro transfer printing. Jumpers 86 can also be applied using micro transfer printing.

In various embodiments of the present invention, the micro-LEDs 40 are formed in a semiconductor substrate using integrated circuit processes. Each micro-LED 40 can have an area or a light-emissive area of less than 500, 250, 100, or 50 square microns. The micro-LEDs 40 can be spaced apart in one or two dimensions, for example by 50 microns or more, 100 microns or more, or 500 microns or more in each dimension over the display area 22. Because micro-LEDs 40 have a relatively small emissive area compared to the display area 22, the emissive fill factor for the LED display 10 can be very low, for example the area of the micro-LEDs 40 over the display area 22 is less than or equal to one-quarter, one eighth, one tenth, one twentieth, one fiftieth, one hundredth, one five-hundredth, one thousandth, one two-thousandth, or one ten-thousandth of the display area 22 itself.

The micro-LEDs 40 can have a variety of different sizes or emissive areas. For example, the micro-LEDs 40 can have a width from 2 to 5 µm, 5 to 10 µm, 10 to 20 µm, or 20 to 50 µm, a length from 2 to 5 µm, 5 to 10 µm, 10 to 20 µm, or 20 to 50 µm, or a height from 2 to 5 µm, 4 to 10 µm, 10 to 20 µm, or 20 to 50 µm.

In some embodiments of the present invention, the light emitters 40 emit light through the display substrate 24. In other embodiments, the light emitters 40 emit light in a direction opposite the display substrate 24.

The display substrate 24 can be any conventional substrate such as glass, plastic, or metal or include such materials. The display substrate 24 can be transparent, for example having a transmissivity greater than or equal to 50%, 80%, 90%, or 95% for visible light. The display substrate 24 usefully has two opposing smooth sides (such as display surface 20) suitable for material deposition, photolithographic processing, or micro-transfer printing of micro-LEDs. The display substrate 24 can have a size of a conventional display, for example a rectangle with a diagonal of a few centimeters to one or more meters and a thickness of 0.1 mm, 0.5 mm, 1 mm, 5 mm, 10 mm, or 20 mm. The light emitters 40 (e.g. micro-LEDs 40) can be provided using photolithographic integrated circuit processes on semiconductor substrates. The micro-LED semiconductor substrates are much smaller than and separate and distinct from the display substrate 24.

The electrical conductors 70 and row or column touch electrodes 80, 84 can be formed on the display substrate 24 using photolithographic and display substrate processing techniques, for example photolithographic processes employing metal or metal oxide deposition using evaporation or sputtering, curable resin coatings (e.g. SU8), positive or negative photo-resist coating, radiation (e.g. ultraviolet radiation) exposure through a patterned mask, and etching methods to form patterned metal structures, vias, insulating layers, and electrical interconnections. Inkjet and screen-printing deposition processes and materials can be used to form patterned conductors or other electrical elements.

Electrical interconnections, or wires, can be fine interconnections, for example having a width of less than 50 microns, less than 20 microns, less than 10 microns, less than five microns, less than two microns, or less than one micron, particularly for micro-LEDs 40 in a pixel element 42. Alternatively, wires can include one or more crude lithography interconnections having a width from 2 μm to 2 mm, wherein each crude lithography interconnection is electrically connected to at least one of the plurality of light emitters 40 on the display substrate 24.

In an embodiment, the light emitters 40 (e.g. micro-LEDs) are transfer printed to the display substrate 24 in one or more transfers. For a discussion of micro-transfer printing techniques see, U.S. Pat. Nos. 8,722,458, 7,622,367 and 8,506,867, each of which is hereby incorporated by reference. The transferred light emitters 40 are then interconnected using similar materials and methods for example with electrical conductors 70 and optionally including connection pads and other electrical connection structures, to enable the controller 50 to electrically interact with the light emitters 40 to emit light in the LED display 10. In an alternative process, the transfer or construction of the light emitters 40 is performed before or after all of the electrical conductors 70 are in place. Thus, in embodiments the construction of the electrical conductors 70 can be performed before the light emitters 40 are printed or after the light emitters 40 are printed or both.

Elements of the present invention can be constructed in a variety of ways. In a first way, the micro-LEDs 40 are formed on a source substrate (for example a semiconductor substrate) using photolithographic methods and then disposed using micro transfer printing onto one or more substrates, for example display substrate 24, insulating layer 32, or light-absorbing layer 30. The display substrate 24 can be glass, metal, or plastic. The source wafer can be a crystalline semiconductor substrate having a much higher circuit performance than thin-film semiconductor layers formed on a glass, plastic or metal backplane substrate. Any of the micro-LEDs 40 can be formed in separate semiconductor substrates that are then individually located and interconnected, for example with photolithographically deposited and patterned metal traces.

The LED display 10 can be formed using micro-transfer techniques. Additional details useful in understanding and performing aspects of the present invention are described in U.S. patent application Ser. No. 14/743,981, filed Jun. 18, 2015, entitled Micro Assembled Micro LED Displays and Lighting Elements, and U.S. patent application Ser. No. 14/754,573 filed Jun. 29, 2015, entitled Small-Aperture-Ratio Display with Electrical Component, the contents of each of which is hereby incorporated by reference in its entirety. In an additional embodiment, a multi-step transfer or assembly process is used with pixel elements 42. By employing such a multi-step transfer or assembly process, increased yields are achieved and thus reduced costs for the active-matrix touchscreen 5 of the present invention. A discussion of compound micro-assembly structures and methods is provided in U.S. patent application Ser. No. 14/822,868, filed Aug. 10, 2015, entitled Compound Micro-Assembly Strategies and Devices, whose contents are included by reference herein in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. In other embodiments, a first layer on a second layer means a first layer in the second layer (e.g., "on" can mean "in or on"). For example, a top portion of the second layer is the first layer. In another example, a light emitter formed on a pixel substrate can be a light emitter formed in a pixel substrate. Moreover, the terms "row" and "column" can be interchanged since they are defined by the orientation of the display substrate 24.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross section
W width
D1 distance
D2 distance
10 light-emitting diode (LED) display with integrated electrode
20 display surface 22 display area
24 display substrate
30 light-absorbing layer
32 insulating layer
34 optical via
40 LED/iLED/micro-LED/light emitter
40R red micro-LED
40G green micro-LED
40B blue micro-LED
42 pixel element
44 pixel group
50 controller
52 control circuit
60 wires
62 bus
70 electrical conductor
80 touch electrode/row touch electrode
82 dummy wires
84 column touch electrode
86 jumper
90 emitted micro-LED light
98 viewing side
99 viewer

What is claimed:

1. A light-emitting diode display with integrated electrodes, comprising:
a display substrate comprising a display surface having a display area;
a plurality of spatially separated printed inorganic light-emitting diodes (LEDs) disposed in rows on the display surface in the display area, the LEDs in each row of the LEDs electrically connected by one or more electrical conductors; and
two or more electrically separate row touch electrodes disposed in rows on the display surface in the display area between rows of the LEDs, wherein each of the two or more row touch electrodes have a width between the rows of the LEDs that is larger than a length and a width of each of the plurality of LEDs, wherein the two or more row touch electrodes are electrically separate from the plurality of LEDs and are electrically separate from the one or more electrical conductors, and wherein the two or more row touch electrodes are disposed only between the LEDs on the display surface and not over or under the LEDs.

2. The display of claim 1, wherein the plurality of spatially separated printed LEDs comprise red light emitters emitting red light, green light emitters emitting green light, and blue light emitters emitting blue light.

3. The display of claim 2, comprising a plurality of pixels, wherein:
each pixel comprises a red light emitter, a green light emitter, and a blue light emitter; and
the distance between any two light emitters in a respective pixel is less than the distance between adjacent pixels.

4. The display of claim 1, wherein the two or more row touch electrodes are opaque.

5. The display of claim 1, comprising one or more column touch electrodes disposed over the display surface in the display area, the one or more column touch electrodes extending in a different direction than the row touch electrodes.

6. The display of claim 5, wherein the LEDs are disposed in columns and the column touch electrodes are disposed only between the columns of LEDs in a direction parallel to the display surface.

7. The display of claim 5, wherein the one or more column touch electrodes are opaque.

8. The display of claim 1, comprising a light-absorbing layer located on a common layer with the LEDs.

9. The display of claim 1, comprising a light-absorbing layer located at least partially between the two or more row touch electrodes and the display surface or at least partially on a side of the row touch electrodes opposite the display surface.

10. The display of claim 1, wherein the two or more row touch electrodes are disposed on the display surface in a common plane with the inorganic light-emitting diodes.

11. The display of claim 1, comprising a controller comprising a controller circuit electrically connected to the two or more row touch electrodes that provides signals to and senses the two or more row touch electrodes to detect touches on or near the LEDs.

12. The display of claim 1, wherein the plurality of LEDs and the two or more row touch electrodes are disposed directly on and in contact with the display surface.

13. A display with an integrated touch screen, comprising:
a display substrate comprising a display surface having a display area;
a plurality of spatially separated printed inorganic light emitters disposed on the display surface in the display area, the plurality of inorganic light emitters electrically connected by one or more electrical conductors; and
a touch screen including two or more electrically separate sensing elements, wherein the sensing elements are disposed only between the inorganic light emitters in a direction parallel to the display surface and in a common plane with the inorganic light emitters and not over or under the inorganic light emitters, and each have a width between adjacent ones of the inorganic light emitters that is larger than a length and a width of each of the plurality of inorganic light emitters, wherein the two or more sensing elements are electrically separate from the plurality of inorganic light emitters and are electrically separate from the one or more electrical conductors.

14. The display of claim 13, wherein the sensing elements are not visually transparent.

15. The display of claim 13, comprising a light-absorbing layer located at least partially in a common layer with the light emitters, at least partially in a layer behind the light emitters in a direction orthogonal to the display surface, or at least partially in a layer on a side of the sensing elements opposite the display surface.

16. The display of claim 15, wherein the light-absorbing layer includes optical vias in which the light emitters are disposed.

17. The display of claim 13, wherein the sensing elements each include two or more sensing components and all of the sensing components are disposed in the common plane with the light emitters.

18. The display of claim 13, wherein the sensing elements each include two or more sensing components and all of the sensing components are disposed on a side of the light emitters opposite the display surface in a direction orthogonal to the display surface.

19. The display of claim 13, wherein the sensing elements each include two or more sensing components and at least one sensing component is disposed in the common plane with the light emitters and at least one sensing component is disposed on a side of the light emitters opposite the display surface in a direction orthogonal to the display surface.

20. A display with an integrated touch screen, comprising:
a display substrate comprising a display surface having a display area;
a plurality of spatially separated printed inorganic light emitters disposed on the display surface in the display area that emit light through the display surface, the plurality of inorganic light emitters electrically connected by one or more electrical conductors; and
a touch screen including two or more electrically separate sensing elements, wherein the sensing elements are disposed on a side of the inorganic light emitters opposite the display surface only between the inorganic light emitters in a direction parallel to the display surface and not over or under the inorganic light emitters, and each have a width between adjacent ones of the inorganic light emitters that is larger than a length and a width of each of the plurality of inorganic light emitters, wherein the two or more sensing elements are electrically separate from the plurality of inorganic light emitters and are electrically separate from the one or more electrical conductors.

21. An inorganic light-emitting diode display with integrated electrodes, comprising:
a display substrate comprising a display surface having a display area;
a plurality of spatially separated printed inorganic light-emitting diodes (LEDs) disposed on the display surface in rows and columns in the display area, the plurality of LEDs electrically connected by one or more electrical conductors;
a plurality of electrically separate row touch electrodes disposed in rows over the display surface in the display area only between the plurality of LEDs in a direction parallel to the display surface and not over or under the LEDs, and each have a width between the rows of the LEDs that is larger than a length and a width of each of the plurality of LEDs, wherein the plurality of row touch electrodes are electrically separate from the plurality of LEDs and are electrically separate from the one or more electrical conductors; and
a plurality of electrically separate column touch electrodes disposed in columns over the display surface in the display area only between the LEDs in a direction parallel to the display surface and not over or under the LEDs, and each have a width between the columns of the LEDs that is larger than a length and a width of each of the plurality of LEDs, wherein the plurality of column touch electrodes are electrically separate from the plurality of LEDs, and are electrically separate from the one or more electrical conductors.

22. The display of claim 21, wherein the row touch electrodes, the column touch electrodes, or both the row touch electrodes and the column touch electrodes are opaque.

23. The display of claim 21, wherein the row touch electrodes, the column touch electrodes, or both the row touch electrodes and the column touch electrodes are located on a side of the LEDs adjacent to the display surface.

* * * * *